United States Patent
Hayakawa

(10) Patent No.: US 8,716,082 B2
(45) Date of Patent: May 6, 2014

(54) SEMICONDUCTOR DEVICE, METHOD OF CONTROLLING THE SAME, AND METHOD OF MANUFACTURING THE SAME

(75) Inventor: Yukio Hayakawa, Fukushima-Ken (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/012,664

(22) Filed: Jan. 24, 2011

(65) Prior Publication Data

US 2011/0116323 A1     May 19, 2011

Related U.S. Application Data

(62) Division of application No. 12/004,919, filed on Dec. 21, 2007, now Pat. No. 7,902,590.

(30) Foreign Application Priority Data

Dec. 27, 2006  (JP) .................................. 2006/353410

(51) Int. Cl.
*H01L 31/119*     (2006.01)

(52) U.S. Cl.
USPC ............ 438/221; 438/295; 438/311; 257/324

(58) Field of Classification Search
USPC .......... 438/221, 295, 311, 359; 257/347, 374, 257/E21.209, 681, E21.613, E21.645, 257/E21.646, E21.662, E21.663, E21.68, 257/E27.076, E27.078, E27.084, E27.085, 257/E27.098, E27.102, E27.104, E29.17, 257/E29.309, 907, 298, 315–326

See application file for complete search history.

(56) References Cited

U.S. PATENT DOCUMENTS

| | | | |
|---|---|---|---|
| 5,635,415 A | 6/1997 | Hong | |
| 6,887,758 B2 | 5/2005 | Chindalore et al. | |
| 6,903,404 B2 * | 6/2005 | Kim | 257/304 |
| 2002/0028541 A1 | 3/2002 | Lee et al. | |
| 2002/0113272 A1 * | 8/2002 | Hsu et al. | 257/371 |
| 2002/0142546 A1 * | 10/2002 | Kouznetsov et al. | 438/257 |
| 2002/0182829 A1 | 12/2002 | Chen | |
| 2006/0138527 A1 | 6/2006 | Bhattacharyya | |
| 2008/0130372 A1 * | 6/2008 | Ghodsi | 365/185.28 |

* cited by examiner

*Primary Examiner* — Julio J Maldonado
*Assistant Examiner* — Mohammad Choudhry

(57) ABSTRACT

The present invention provides a system comprising a semiconductor device, a method of controlling the semiconductor device in the system, and a method of manufacturing the semiconductor device in the system. The semiconductor device includes: a semiconductor region located in a semiconductor layer formed on an isolating layer; an ONO film on the semiconductor region; bit lines on either side of the semiconductor region, which are located in the semiconductor layer, and are in contact with the isolating layer; a device isolating region on two different sides of the semiconductor region from the sides on which the bit lines are located, the device isolating region being in contact with the isolating layer; and a first voltage applying unit that is coupled to the semiconductor region. In this semiconductor device, the semiconductor region is surrounded by the bit lines and the device isolating region, and is electrically isolated from other semiconductor regions.

18 Claims, 20 Drawing Sheets

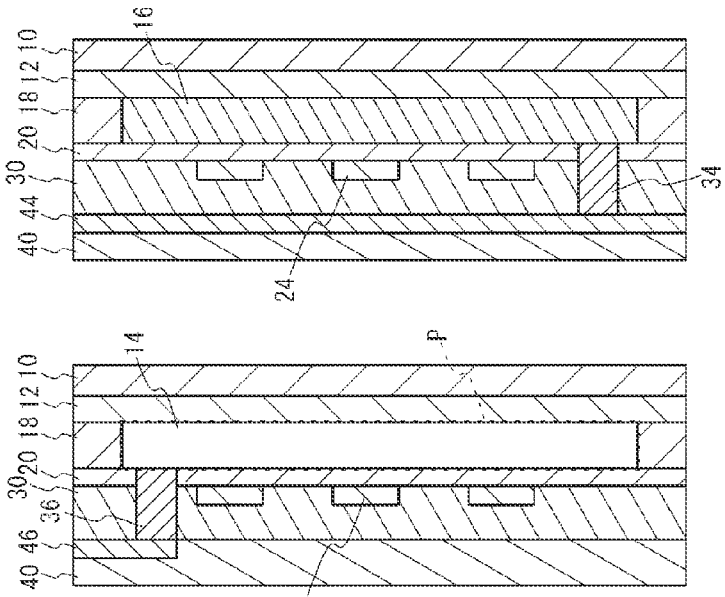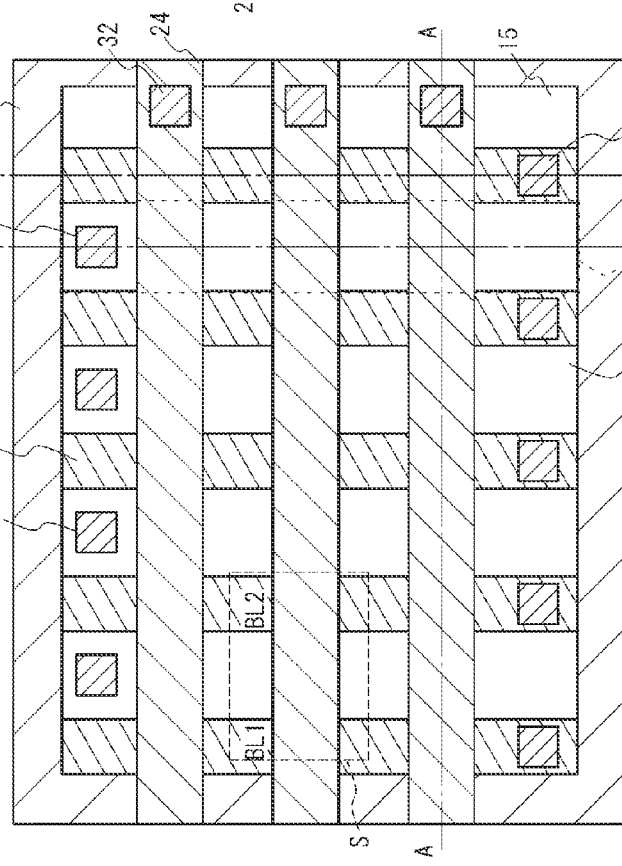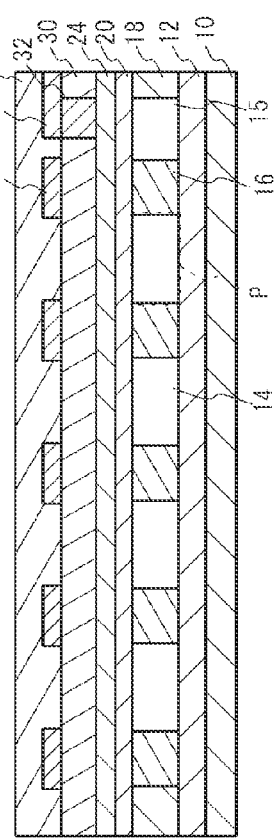

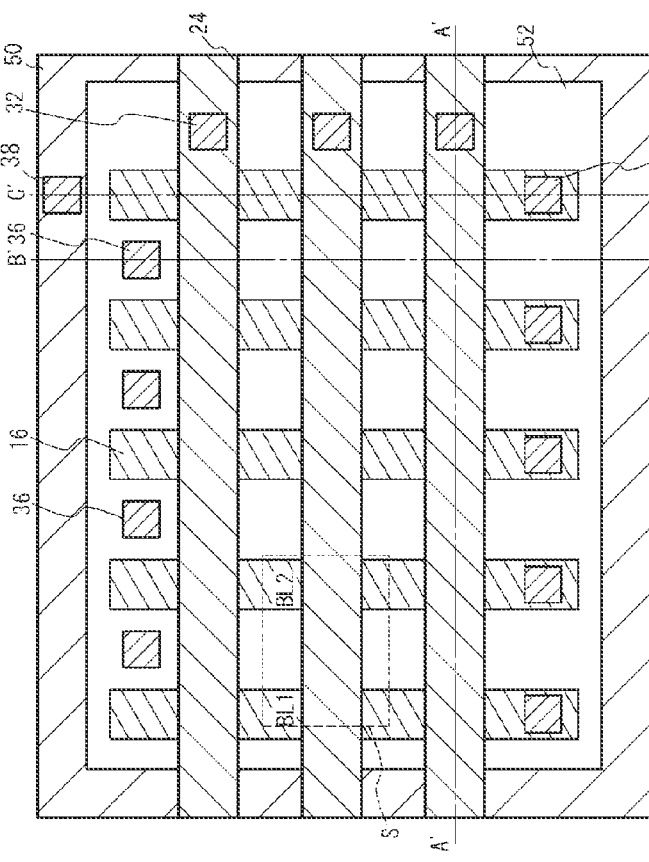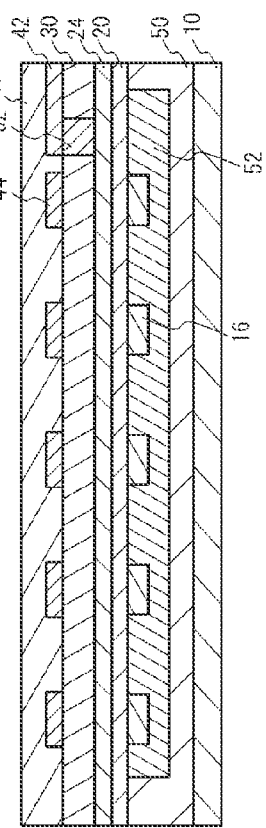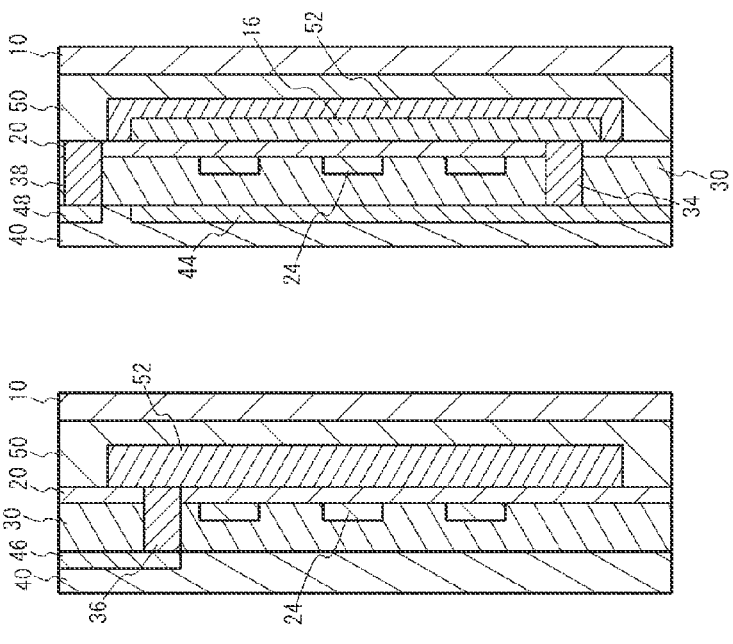

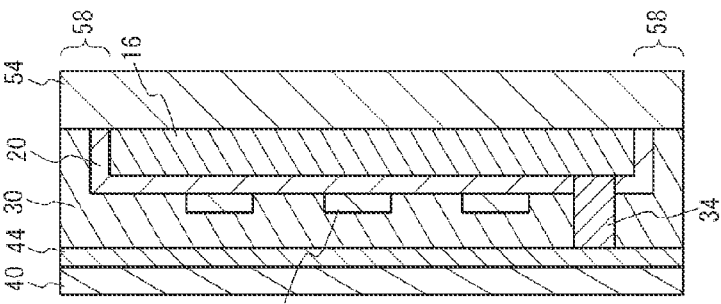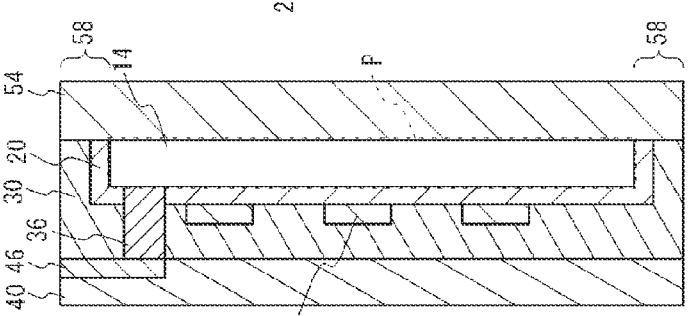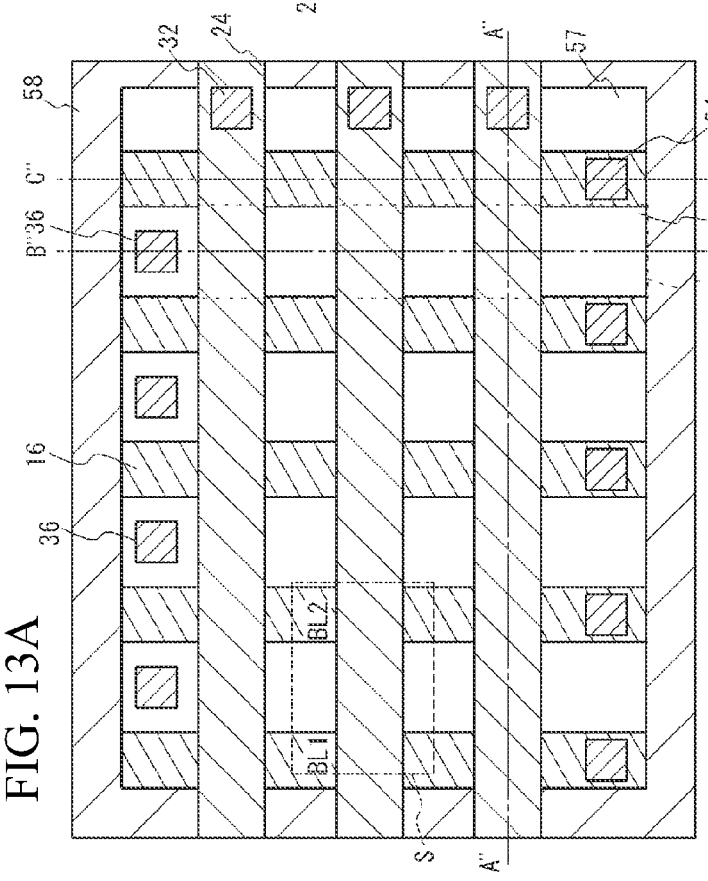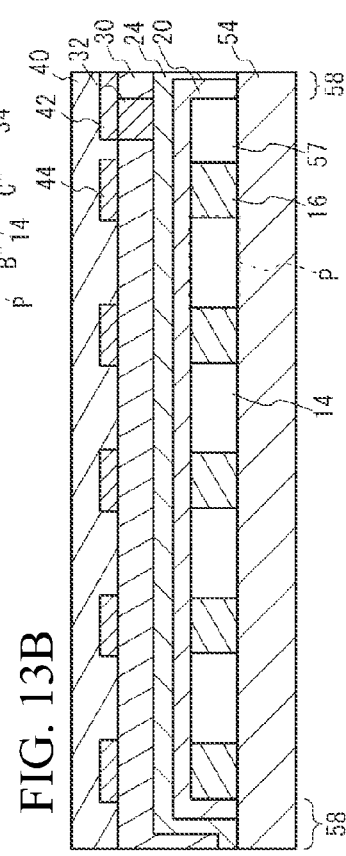

ND METHOD# SEMICONDUCTOR DEVICE, METHOD OF CONTROLLING THE SAME, A OF MANUFACTURING THE SAME

CROSS-REFERENCES TO RELATED APPLICATIONS

This application is a divisional application of U.S. patent application Ser. No. 12/004,919, incorporated herein, filed Dec. 21, 2007, and which claims priority from Japanese patent application No. JP2006/353410, filed Dec. 27, 2006 and was not published in English.

TECHNICAL FIELD

This invention relates generally to systems including semiconductor devices, methods of controlling the semiconductor devices within the systems, and methods of manufacturing the semiconductor devices. More particularly, this invention relates to a system including a semiconductor device that applies a voltage to the semiconductor substrate of each memory cell in a selected area, a method of controlling the semiconductor device, and a method of manufacturing the semiconductor device.

BACKGROUND OF THE INVENTION

Recently, non-volatile memories that are data-rewritable semiconductor devices have become widely used. Such non-volatile memories include flash memories having a SONOS (Silicon Oxide Nitride Oxide Silicon) structure that accumulates charges in a trapping layer in an ONO (Oxide/Nitride/Oxide) film.

U.S. Pat. No. 6,011,725 discloses a SONOS flash memory that has virtual-ground memory cells each performing an interchange between the source and the drain, and a method of operating the source and the drain in a symmetrical fashion. In this flash memory, bit lines that also serve as the source and the drain are formed in the semiconductor substrate, and charges can be accumulated in the trapping layer in an ONO film formed on the semiconductor substrate. By performing an interchange between the source and the drain, two charge accumulating regions can be formed in one memory cell.

In such a memory cell, data writing (or charge accumulation in the ONO film) is performed by applying a high voltage between the source and the drain, so as to generate positive charges at the gate. As a result, hot electrons generated with high energy between the source and the drain, are injected into the trapping layer. The source and the drain are interchanged with each other, so that charges can be stored at two locations in the trapping layer. Through the accumulation of charges (electrons) in the trapping layer, the threshold voltage of the transistor forming the memory cell also changes. By detecting the threshold voltage, the data can be read out.

Data erasing (or removal of charges from the trapping layer) in such a memory cell is performed by the following methods. By one of the methods, a positive voltage is applied to the drain, and a negative voltage is applied to the gate. As a result, electron-hole pairs are generated due to interband tunneling in the vicinity of the drain, and hot holes generated with high energy in the electric field between the gate and the drain are injected into the trapping layer. The holes injected into the trapping layer are coupled with the charges (electrons) accumulated in the trapping layer, and the charges in the trapping layer disappear. By another method, a negative voltage is applied to the gate, and a positive voltage is applied to the semiconductor substrate. As a result, the charges in the trapping layer are released as a FN (Fowler-Nordheim) tunneling current, and the charges disappear from the inside of the trapping layer.

SUMMARY OF THE INVENTION

In the above described conventional flash memory, the distance between the bit lines may not be shortened, thereby prohibiting a favorable reduction in the size of each memory cell. In addition, according to the above described conventional flash memory, a voltage would need to be applied to the semiconductor substrate of each memory cell in the selected area when the charges in the trapping layer are eliminated by the FN tunneling effect.

The present invention has been made in view of the above circumstances and provides a system including a semiconductor device, a method of controlling the semiconductor device within the system, and a method of manufacturing the semiconductor device in the system, by which the distance between bit lines can be shortened, and a voltage can be applied to the semiconductor substrate of each memory cell in a selected area.

According to an aspect of the present invention, there is provided a system including a semiconductor device comprising: a semiconductor region located in a semiconductor layer formed on an isolating layer; an ONO film on the semiconductor region; bit lines on either side of the semiconductor region, which are located in the semiconductor layer, and are in contact with the isolating layer; a device isolating region on two different sides of the semiconductor region from the sides on which the bit lines are located, the device isolating region being in contact with the isolating layer; and a first voltage applying unit that is coupled to the semiconductor region; wherein the semiconductor region is surrounded by the bit lines and the device isolating region, and is electrically isolated from other semiconductor regions. According to this aspect, the semiconductor region is electrically isolated from other semiconductor regions by the isolating layer, the device isolating region, and the bit lines. Further, the first voltage applying unit applies a voltage to the semiconductor region, so that a voltage can be applied to the semiconductor substrate of each memory cell in a selected area.

According to another aspect of the present invention, there is provided a method of controlling the semiconductor device of a system, the semiconductor device comprising a semiconductor region, an ONO film on the semiconductor region, and bit lines located on either side of the semiconductor region, the method including: accumulating charges in the ONO film; and eliminating charges in a skirt area of a distribution of the charges accumulated in the ONO film. According to this aspect, the skirt areas of distributions of charges accumulated in two locations of the trapping layer of one memory cell can be prevented from overlapping with each other when the distance between the bit lines is shortened. Thus, the size of the memory cell can be reduced.

According to yet another aspect of the present invention, there is provided a method of controlling a semiconductor device of a system, the semiconductor device including: a semiconductor region located in a semiconductor layer formed on an isolating layer; an ONO film on the semiconductor region; bit lines on either side of the semiconductor region, which are located in the semiconductor layer, and are in contact with the isolating layer; a device isolating region on two different sides of the semiconductor region from the sides on which the bit lines are located, the device isolating region being in contact with the isolating layer; and a first voltage applying unit that is coupled to the semiconductor region, the semiconductor region being surrounded by the bit lines and the device isolating region, and being electrically isolated from other semiconductor regions, the method including: applying a voltage to the semiconductor region; and eliminating charges accumulated in the ONO film. According to this aspect, the semiconductor region is electrically isolated from other semiconductor regions by the isolating layer, the device isolating region, and the bit lines. Furthermore, the first voltage applying unit applies a voltage to the semiconductor region, so that the data in each memory cell in a selected area can be erased.

According to a further aspect of the present invention, there is provided a method of manufacturing a semiconductor device in a system, including: forming a semiconductor layer on an isolating layer; forming bit lines in the semiconductor layer, the bit lines being in contact with the isolating layer; forming a device isolating region in contact with the isolating layer; forming an ONO film on a semiconductor region that is located between regions in which the bit lines are formed; and forming a first voltage applying unit that is coupled to the semiconductor region, wherein the device isolating region is formed on two different sides of the semiconductor region from sides on which the bit lines are formed, so as to be in contact with the isolating layer. According to this aspect, the semiconductor region is electrically isolated from other semiconductor regions by the isolating layer, the device isolating region, and the bit lines. Further, it is possible to produce a semiconductor device that can apply a voltage to the semiconductor substrate of each memory cell in a selected area, as the first voltage applying unit applies a voltage to the semiconductor region.

According to a still further aspect of the present invention, there is provided a method of manufacturing a semiconductor device in a system, the method including: forming an n-type semiconductor layer in a semiconductor substrate; forming a p-type semiconductor substrate in the n-type semiconductor layer so that the bottom surface and the side surfaces of the p-type semiconductor substrate are in contact with the n-type semiconductor layer; forming bit lines in the p-type semiconductor layer; forming an ONO film on a semiconductor region that is located between regions in which the bit lines are formed; forming a first voltage applying unit that is coupled to the semiconductor region; and forming a second voltage applying unit that is coupled to the n-type semiconductor layer. According to this aspect, as a voltage is applied to the second voltage applying unit, a depletion layer surrounded by the semiconductor region, the n-type semiconductor layer, and the bit lines can be formed. With the depletion layer, the semiconductor region can be electrically isolated from the other semiconductor regions. Further, as the first voltage applying unit applies a voltage to the semiconductor region, the data in each memory cell in a selected area can be erased.

BRIEF DESCRIPTION OF THE DRAWINGS

FIG. 1A is a top view of a flash memory in accordance with a first embodiment of the present invention;

FIG. 1B is a cross-sectional view of the flash memory, taken along the line A-A of FIG. 1A in accordance with a first embodiment of the present invention;

FIG. 1C is a cross-sectional view of the flash memory, taken along the line B-B of FIG. 1A in accordance with a first embodiment of the present invention;

FIG. 1D is a cross-sectional view of the flash memory, taken along the line C-C of FIG. 1A in accordance with a first embodiment of the present invention;

FIG. 10A is a top view of a flash memory in accordance with a second embodiment of the present invention;

FIG. 10B is a cross-sectional view of the flash memory, taken along the line A'-A' of FIG. 10A in accordance with a second embodiment of the present invention;

FIG. 10C is a cross-sectional view of the flash memory, taken along the line B'-B' of FIG. 10A in accordance with a second embodiment of the present invention;

FIG. 10D is a cross-sectional view of the flash memory, taken along the line C'-C' of FIG. 10A in accordance with a second embodiment of the present invention;

FIG. 13A is a top view of a flash memory in accordance with a third embodiment of the present invention;

FIG. 13B is a cross-sectional view of the flash memory, taken along the line A"-A" of FIG. 13A in accordance with a third embodiment of the present invention;

FIG. 13C is a cross-sectional view of the flash memory, taken along the line B"-B" of FIG. 13A in accordance with a third embodiment of the present invention;

FIG. 13D is a cross-sectional view of the flash memory, taken along the line C"-C" of FIG. 13A in accordance with a third embodiment of the present invention;

DETAILED DESCRIPTION

Figure 2A:
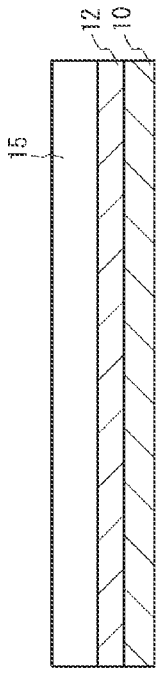
FIG. 2A through FIG. 2H are cross-sectional views illustrating a method of manufacturing the flash memory in accordance with the first embodiment of the present invention.

A description will now be given, with reference to the accompanying drawings, of embodiments of the present invention.

First Embodiment

A first embodiment is an example case where a SOI (Semiconductor on Insulator) structure is employed, an insulating layer of a SOI structure is used as an isolation layer, and a buried oxide film is used as device isolating regions. FIG. 1A is a top view of the memory cell region of a flash memory in accordance with the first embodiment (a protection film 40, wiring layers 42, 44, and 46, an interlayer insulating film 30, and an ONO film 20 are not shown). FIG. 1B, FIG. 1C, and FIG. 1D are cross-sectional views, taken along the lines A-A, B-B, and C-C of FIG. 1A, respectively. As shown in FIG. 1B and FIG. 1C, an insulating layer 12 (an isolation layer) formed with a silicon oxide film is provided on a silicon semiconductor substrate 10. A p-type silicon semiconductor layer 15 is provided on the insulating layer 12. The semiconductor layer 15 and the insulating layer 12 form a SOI structure. The semiconductor layer 15 includes semiconductor regions 14 and bit lines 16.

As shown in FIG. 1A, the bit lines 16 that also serve as n-type sources and drains are formed in the semiconductor layer 15, and the portions of the semiconductor layer 15 located between the bit lines 16 are the semiconductor regions 14. The bit lines 16 and the semiconductor regions 14 are surrounded by a device isolating region 18 formed with a buried oxide film. FIG. 1B shows the bit lines 16 that extend to the insulating layer 12, and the device isolating region 18 that also extends to the insulating layer 12. FIG. 1C shows one of the semiconductor regions 14 and the device isolating region 18 surrounding the semiconductor regions 14. FIG. 1D shows the bit lines 16 and the device isolating region 18 surrounding the bit lines 16. As shown in FIG. 1A through FIG. 1D, the structure of this embodiment has semiconductor regions 14 that are formed in the semiconductor layer 15, the bit lines 16 that are formed on either side of each of the semiconductor regions 14 in the semiconductor layer and extend to the insulating layer 12, and the device isolating region 18 that is formed on different sides of the semiconductor regions 14 from the bit lines 16 and extends to the insulating layer 12. The semiconductor regions 14 are surrounded by the bit lines 16 and the device isolating region 18, and are electrically isolated from one another.

As shown in FIG. 1B through FIG. 1D, the ONO film 20 is provided over the semiconductor regions 14, the bit lines 16, and the device isolating region 18. As shown in FIG. 1A, word lines 24 that intersect with the bit lines 16 are provided on the ONO film 20. In FIG. 1B, the word lines 24 are provided on the ONO film 20, and extend in the cross-sectional direction. As shown in FIG. 1C and FIG. 1D, more than one word line 24 is provided on the ONO film 20. As shown in FIG. 1B and FIG. 1C, an interlayer insulating film 30 is provided over the word lines 24 and the ONO film 20. The interlayer insulating film 30 has metal plugs 32, 34, and 36 coupled to the word lines 24, the bit lines 16, and the semiconductor regions 14. Wiring layers 42, 44, and 46 that are coupled to the metal plugs 32, 34, and 36 are formed on the interlayer insulating film 30. A protection film 40 is provided over the interlayer insulating film 30 and the wiring layers 42, 44, and 46. As shown in FIG. 1A and FIG. 1C, the semiconductor regions 14 are surrounded by the bit lines 16, the device isolating region 18, and the insulating layer 12, so as to form regions P. With the metal plugs 36 coupled to the semiconductor regions 14 and the wiring layer 46 (a first voltage applying unit), a voltage can be applied to each semiconductor region 14 in each corresponding region P.

Referring now to FIG. 2A through FIG. 3F, a method of manufacturing the flash memory in accordance with the first embodiment is described. FIG. 2A through FIG. 2D and FIG. 3A through FIG. 3C are cross sectional views, taken along the line A-A of FIG. 1A. FIG. 2E through FIG. 2H and FIG. 3D through FIG. 3F are cross-sectional views, taken along the line B-B of FIG. 1A.

Figure 2B:
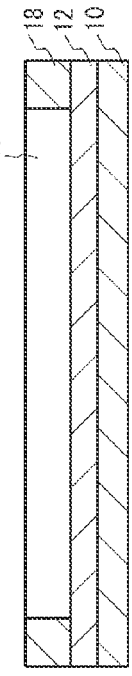
Figure 2C:
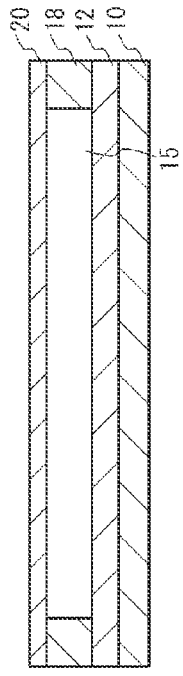
Figure 2D:
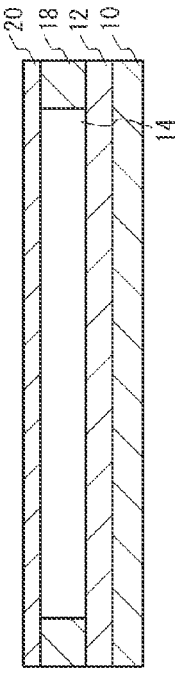
Figure 2E:
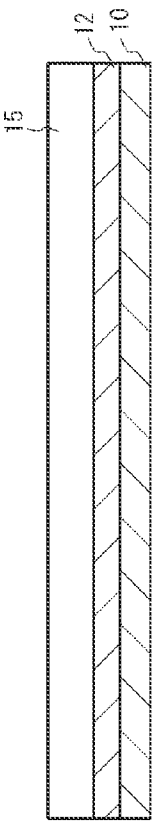
Figure 2F:
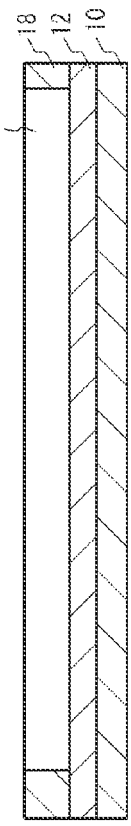
Figure 2G:
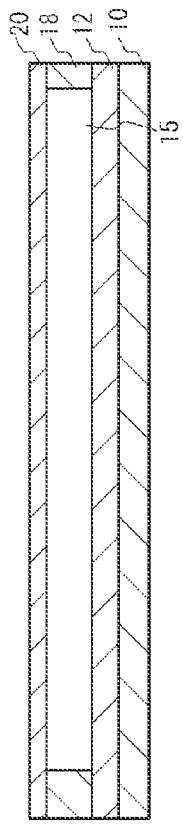
Figure 2H:
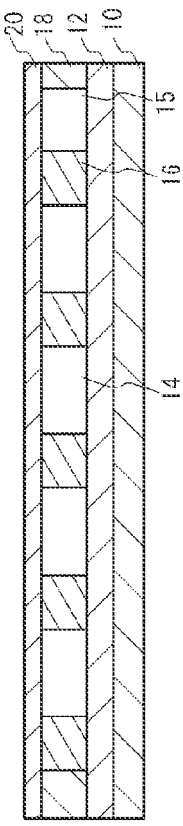

As shown in FIG. 2A and FIG. 2E, the insulating layer 12 formed with a silicon oxide layer is formed on the silicon semiconductor substrate 10, and a p-type silicon semiconductor layer 15 is formed on the insulating layer 12. As shown in FIG. 2B and FIG. 2F, the device isolating region 18 formed with a buried oxide film that reaches the insulating layer 12 is formed by the STI (Shallow Trench Isolation) method. Here, the device isolating region 18 is formed on different sides of the region to be the semiconductor regions 14 from the sides on which the bit lines 16 are to be formed. As shown in FIG. 2C and FIG. 2G, a tunnel oxide film formed with a silicon oxide film, a trapping layer formed with a silicon nitride film, and a top oxide film formed with a silicon oxide film are formed over the semiconductor layer 15 and the device isolating region 18. With this arrangement, the ONO film 20 is formed over the semiconductor layer 15 (or the regions that become the semiconductor regions 14 between the regions that become the bit lines 16) and the device isolating region 18. As shown in FIG. 2D and FIG. 2H, arsenic ions, for example, are injected into the semiconductor layer 15, so as to form the bit lines 16 that reach the insulating layer 12. In this manner, the semiconductor regions 14 are formed between the bit lines 16.

Figure 3A:
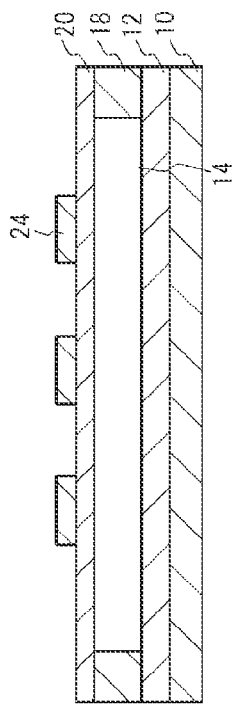
FIG. 3A through FIG. 3F are cross-sectional views illustrating the method of manufacturing the flash memory in accordance with the first embodiment of the present invention.
Figure 3B:
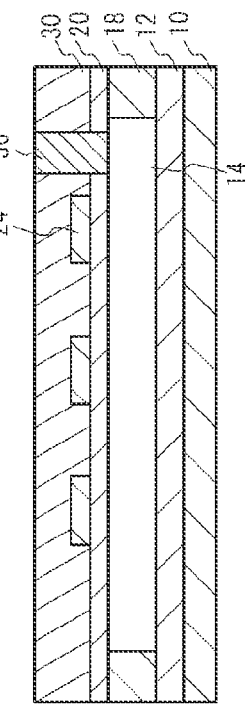
Figure 3C:
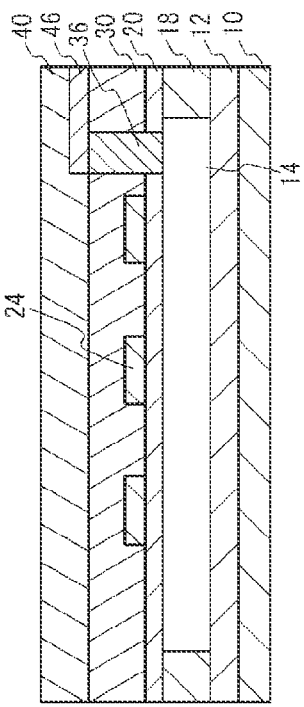
Figure 3D:
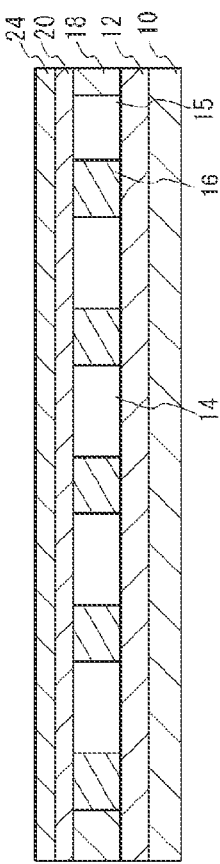
Figure 3E:
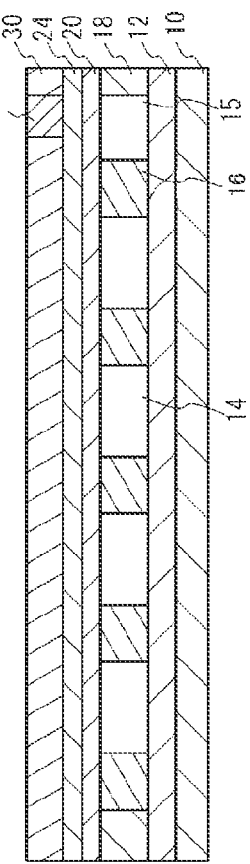
Figure 3F:
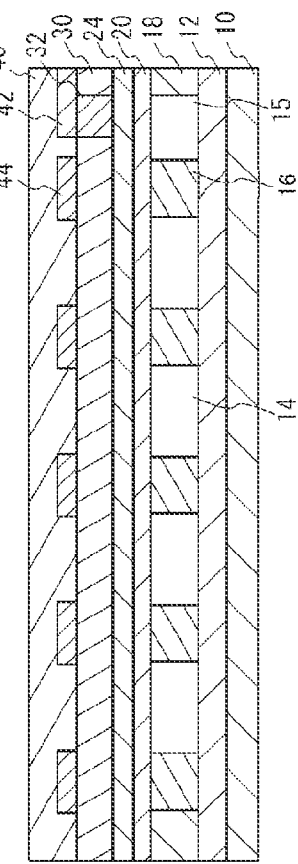

As shown in FIG. 3A and FIG. 3D, the word lines 24 that intersect with the bit lines 16 are formed with polycrystalline silicon on the ONO film 20. As shown in FIG. 3B and FIG. 3E, a silicon oxide film is formed as the interlayer insulating film 30 over the word lines 24 and the ONO film 20. Contact holes are formed in the interlayer insulating film 30, and the contact holes are filled with tungsten, for example. In this manner, the metal plugs 32, 34, and 36 coupled to the word lines 24, the semiconductor regions 14, and the bit lines 16 are formed. As shown in FIG. 3C and FIG. 3F, the wiring layers 42, 44, and 46 coupled to the metal plugs 32, 34, and 36 are formed on the interlayer insulating film 30. The protection film 40 made of silicon oxide film is then formed over the wiring layers 42, 44, and 46, and the interlayer insulating film 30. In this manner, the flash memory in accordance with the first embodiment is completed.

Next, a method of controlling the flash memory in a system in accordance with the first embodiment is described. Table 1 shows voltages Vb1, Vb2, Vg, and Vsub to be applied to bit lines BL1 and BL2, the word lines 24 (the gate), and the semiconductor regions 14 when data programming, reading, or erasing is performed on the flash memory in accordance with the first embodiment.

TABLE 1

| Operation | | Vb1 | Vb2 | Vg | Vsub |
|---|---|---|---|---|---|
| Program | Charge injection | 0 V | 4 V | 9 V | 0 V |
|  | Tail-cut | 8 V | 8 V | −3 V | 6 V |
| Reading |  | 1.5 V | 0 V | 5 V | 0 V |
| Erasing | Hot hole injection | 2 V | 6 V | −6 V | 2 V |
|  | FN tunneling | 4 V | 4 V | −8 V | 4 V |

Figure 4:
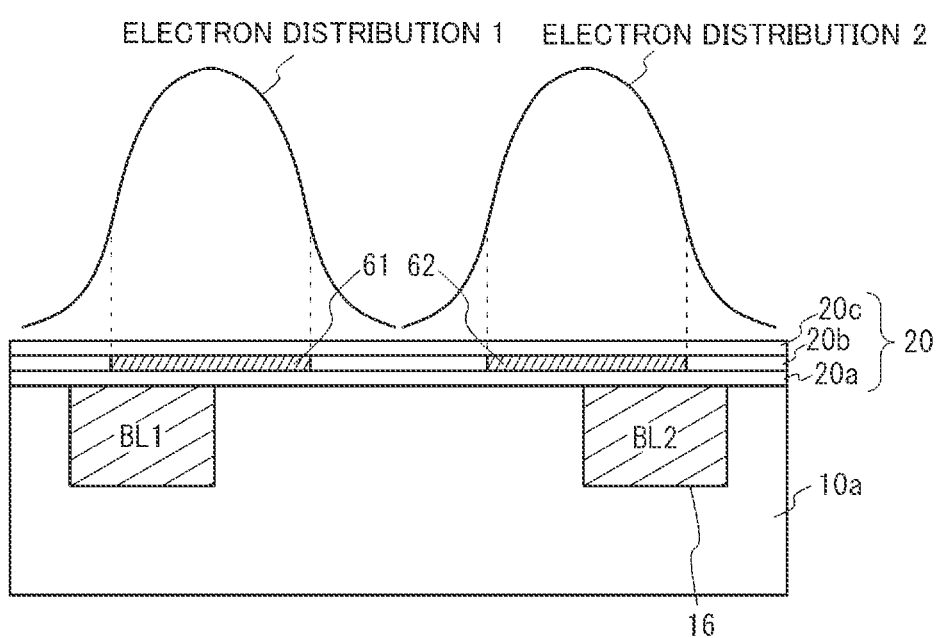
FIG. 4 is a schematic view illustrating the conventional technique.

First, a control operation performed when data is programmed is described. FIG. 4 illustrates the problem with the conventional flash memory disclosed in U.S. Pat. No. 6,011,725. As shown in FIG. 4, bit lines BL1 and BL2 are provided in a semiconductor substrate 10a. The portion of the semiconductor substrate 10a located between the bit lines BL1 and BL2 forms the channel. An ONO film 20 formed with a tunnel oxide film 20a, a trapping layer 20b, and a top oxide film 20c is provided on the semiconductor substrate 10a. The word lines, and the interlayer insulating film and the wiring layers above the word lines are not shown. FIG. 4 shows a case where charges 61 and 62 are accumulated in two locations in the trapping layer 20b in the vicinities of the bit lines BL1 and BL2 of one transistor forming a memory cell. More specifically, charge accumulating regions are formed in the portions of the ONO film 20 located between the bit lines 16 and under the word lines 24. The curves of an electron distribution 1 and an electron distribution 2 shown above the ONO film 20 represent the electron distributions in the trapping layer 20b. The vertical direction indicates the electron density, and the electron distributions are Gaussian distributions. When the distances between the bit lines 16 are shortened so as to reduce the size of the memory cell, the skirts of the electron distributions 1 and 2 overlap with each other, resulting in an error. Therefore, it is difficult to reduce the size of the memory cell disclosed in U.S. Pat. No. 6,011,725.

Figure 5:
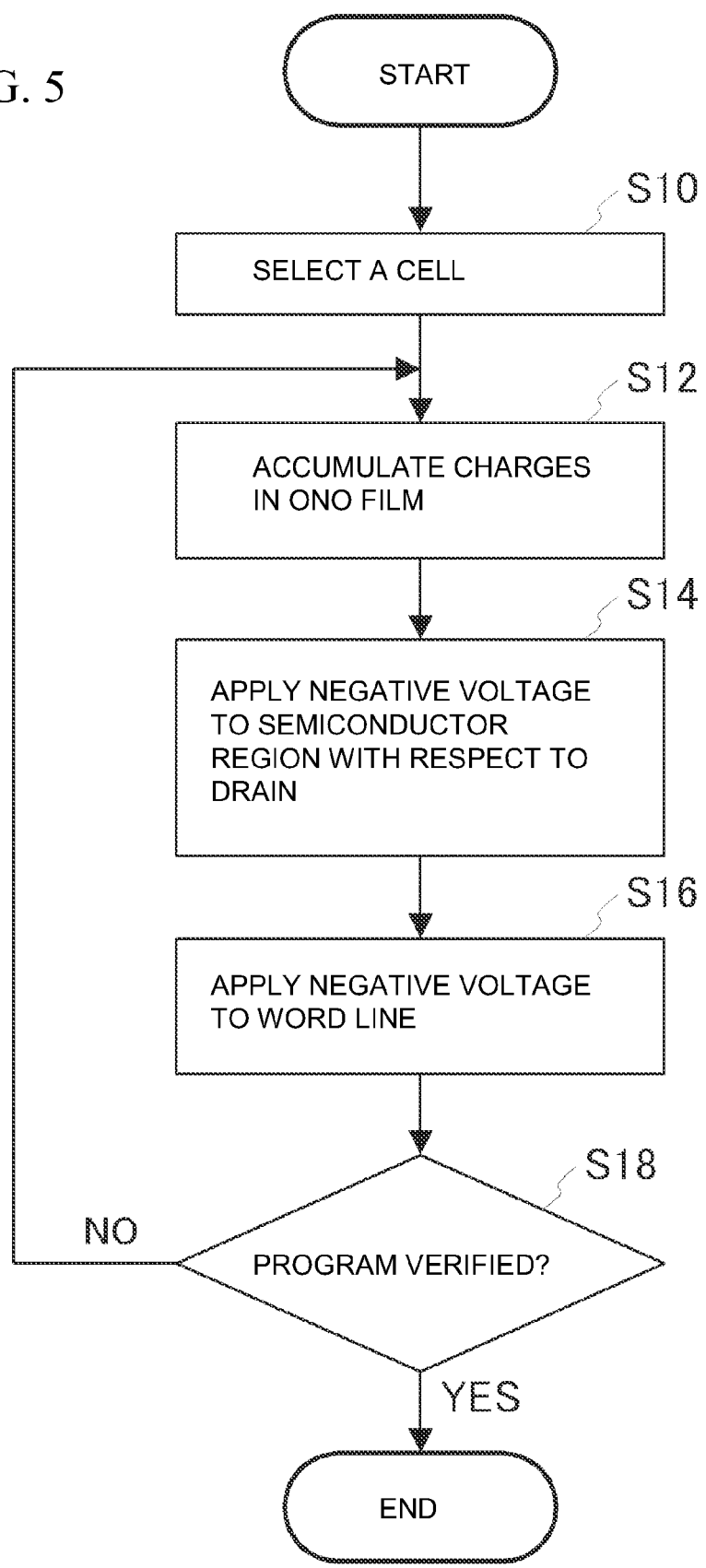
FIG. 5 is a flowchart of an operation to be performed when data programming is performed in the first embodiment of the present invention.
Figure 6A:
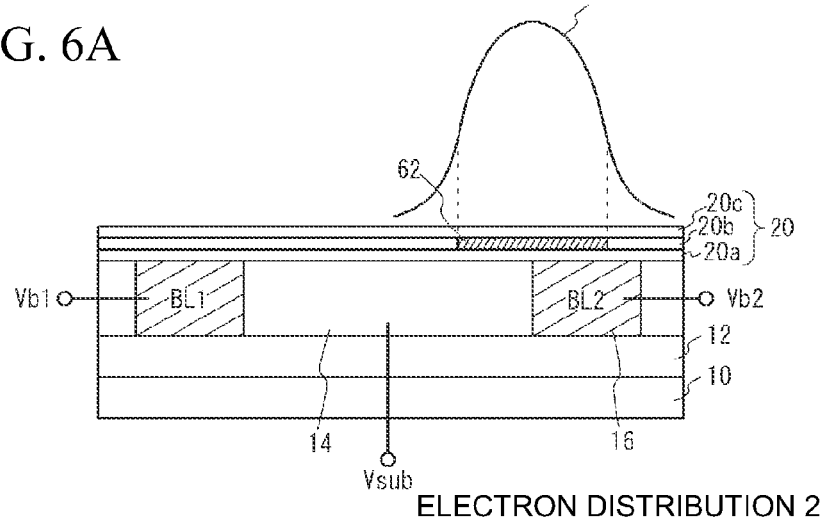
FIG. 6A through FIG. 6C are schematic views illustrating a method of programming data in the first embodiment of the present invention.
Figure 6B:
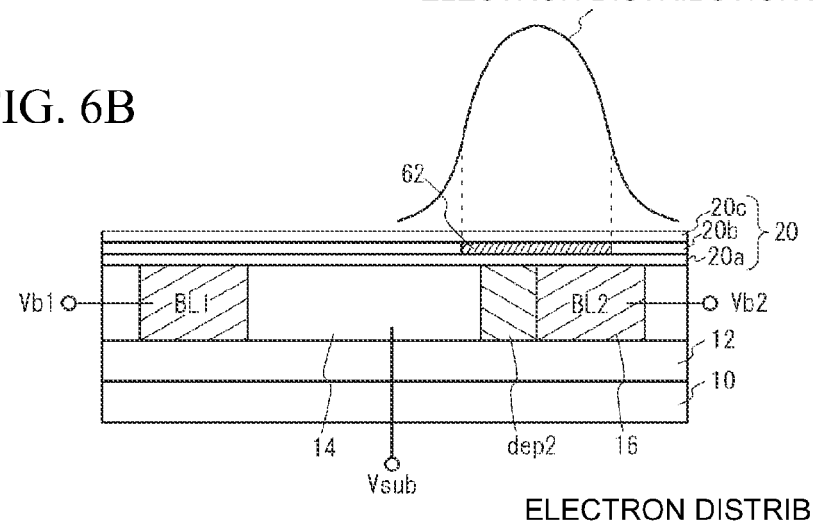
Figure 6C:
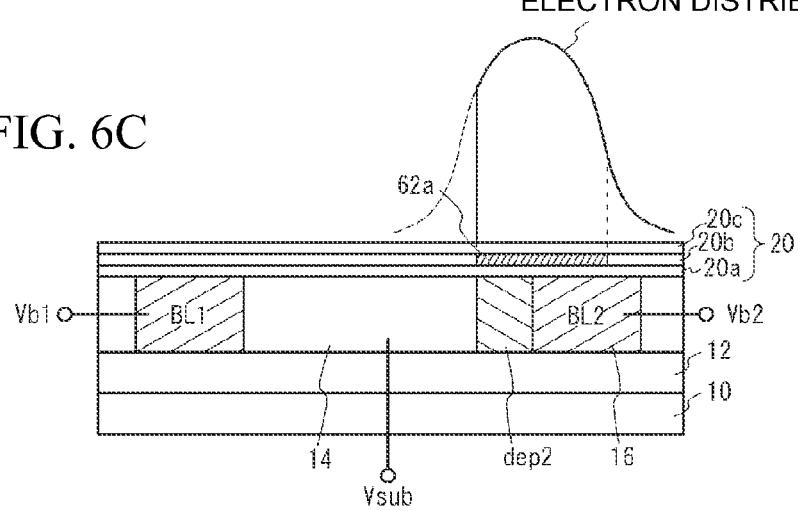

To counter this problem, the following control operation is performed in the first embodiment. First, a case where charges are accumulated in the portion of the trapping layer 20b located in the vicinity of the bit line BL2 is described. FIG. 5 is a flowchart of an operation to be performed in that case. FIG. 6A through FIG. 6C schematically show the distribution of electrons accumulated in the trapping layer in that case. In FIG. 6A through FIG. 6C, the semiconductor substrate 10a of FIG. 4 is replaced with the semiconductor substrate 10 and the insulating layer 12. The voltages to be applied to the bit lines BL1 and BL2 and the semiconductor region 14 are represented by Vb1, Vb2, and Vsub, respectively. The same components as those shown in FIG. 4 are denoted by the same reference numerals as those in FIG. 4, and explanation of them is omitted here.

As shown in FIG. 5, a memory cell on which data programming is to be performed (or in which charges are to be accumulated) is selected first (step S10). The voltages for charge injection shown in Table 1 are applied to the respective terminals. More specifically, the voltages Vb1 (=0V), Vb2 (=4V), Vg (=9V), and Vsub (=0V) are applied to the bit lines BL1 (the source) and BL2 (the drain), the word line 24 (the gate), and the semiconductor region 14, respectively. As a result, the hot electrons generated with high energy between the bit lines BL1 and BL2 are injected into the trapping layer 20b, and charges are accumulated in the ONO film 20 (step S12). As shown in FIG. 6A, the charges 62 are accumulated in the portion of the trapping layer 20b in the vicinity of the bit line BL2, and the distribution of the electrons is shown as the electron distribution 2.

Next, among the tail-cut voltages shown in Table 1, the voltages Vb2 (=8V) and Vsub (=6V) are applied. In this manner, a negative voltage with respect to the bit line BL2 (the drain) is applied to the semiconductor region 14 (step S14). As shown in FIG. 6B, as the bit line BL2 and the semiconductor region 14 form a reversely-biased pn junction, a depletion layer dep2 is formed between the bit line BL2 and the semiconductor region 14. Among the tail-cut voltages shown in Table 1, the voltage Vg (=−3V) is then applied (step S16). As shown in FIG. 6C, a voltage of 9V is applied between the word lines 24 (the gate, not shown) and the semiconductor region 14. The electrons in the trapping layer 20b above the portion of the semiconductor region 14 that is not the depletion layer dep2 flow as a FN tunneling current into the semiconductor region 14. As a result, the amount of electrons in the skirt area of the electron distribution 2 decreases, and the electron distribution 2 is turned into an electron distribution 2a. Program verification is then performed. If the result of the program verification is "OK," the operation is ended. If not, the operation returns to step S12 (step S18).

Figure 7:
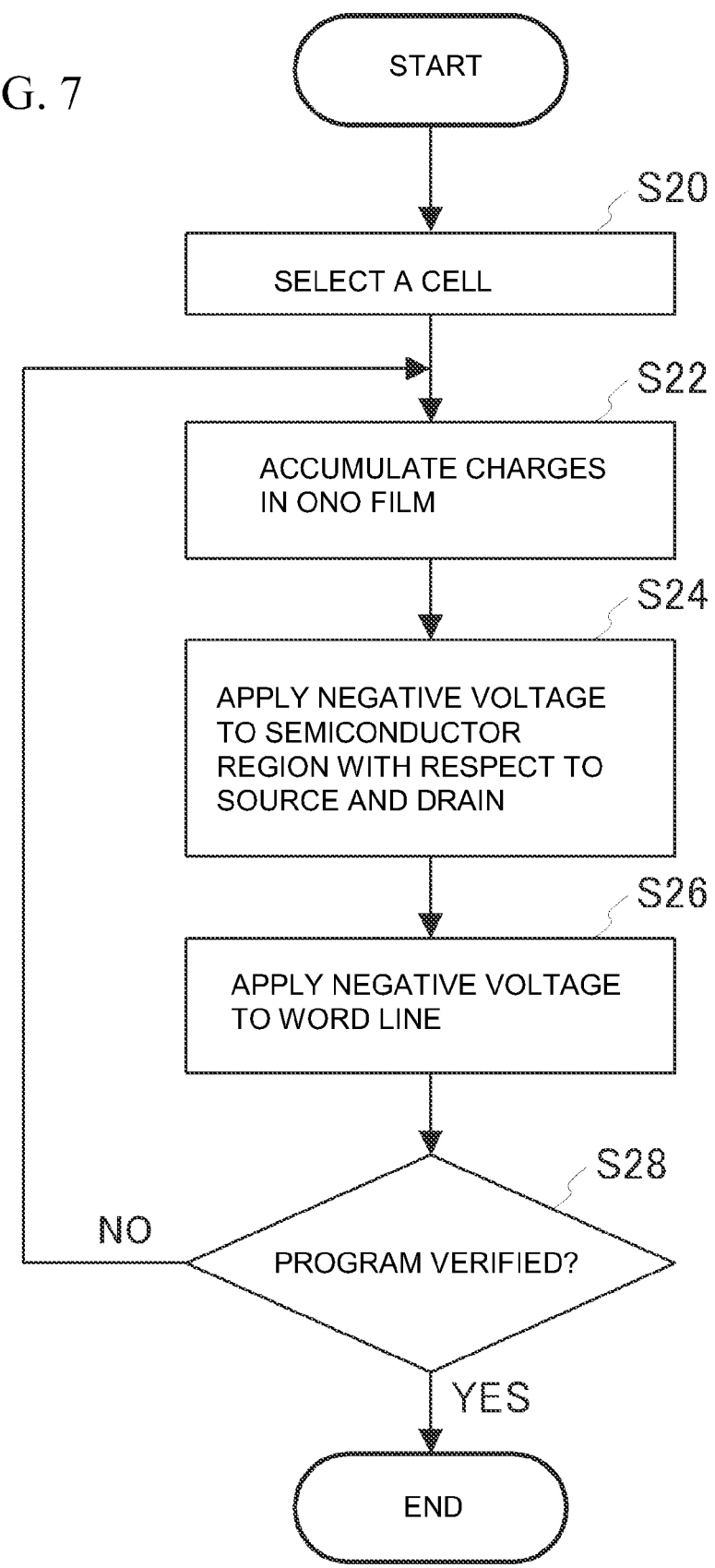
FIG. 7 is a flowchart of another operation to be performed when data programming is performed in the first embodiment of the present invention.
Figure 8A:
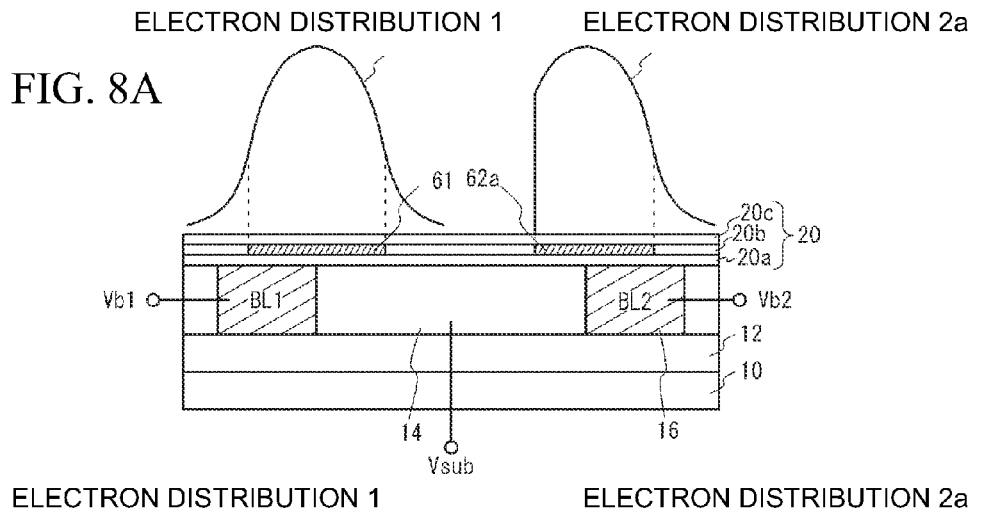
FIG. 8A through FIG. 8C are schematic views illustrating another method of programming data in the first embodiment of the present invention.
Figure 8B:
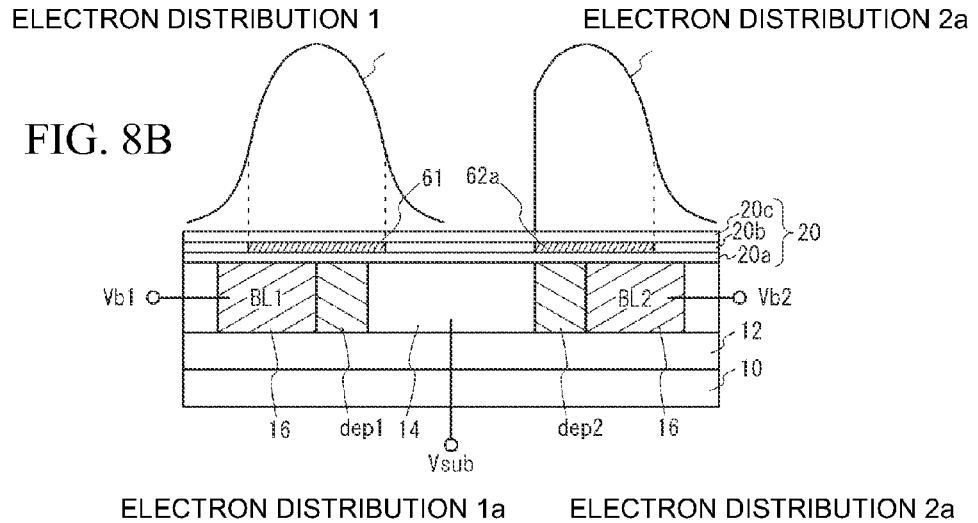
Figure 8C:
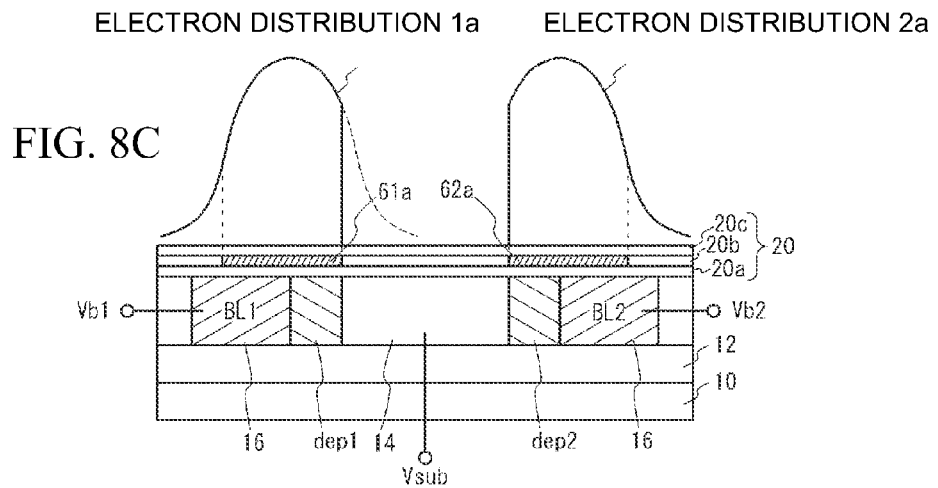

Next, a case where charges are accumulated in the portion of the trapping layer 20b in the vicinity of the bit line BL1 is described. FIG. 7 is a flowchart of an operation to be performed in that case. FIG. 8A through FIG. 8C schematically show the distributions of electrons accumulated in the trapping layer in that case. FIG. 8A through FIG. 8C are similar to FIG. 6A through FIG. 6C. The same components as those shown in FIG. 6A through FIG. 6C are denoted by the same reference numerals as those shown in FIG. 6A through FIG. 6C, and explanation of them is omitted here.

As shown in FIG. 7, a memory cell on which data programming is to be performed (or in which charges are to be accumulated) is selected first (step S20). The voltages for charge injection shown in Table 1 are applied to the respective terminals. Here, the voltages to be applied to the bit lines BL1 and BL2 are switched. More specifically, the voltage Vb1 (=4V), the voltage Vb2 (=0V), the voltage Vg (=9V), and the voltage Vsub (=0V) are applied to the bit lines BL1 (the source), the bit line BL2 (the drain), the word line 24 (the gate), and the semiconductor region 14, respectively. As a result, the hot electrons generated with high energy between the bit lines BL1 and BL2 are injected into the trapping layer 20b, and charges are accumulated (step S22). As shown in FIG. 8A, the charges 61 are accumulated in the portion of the trapping layer 20b in the vicinity of the bit line BL1, and the distribution of the electrons is shown as the electron distribution 1.

Next, among the tail-cut voltages shown in Table 1, the voltage Vb1 (=8V), the voltage Vb2 (=8V), and the voltage Vsub (=6V) are applied. In this manner, a negative voltage with respect to the bit lines BL1 (the drain) and BL2 (the source) is applied to the semiconductor region 14 (step S24). As shown in FIG. 8B, a depletion layer dep1 is formed between the bit line BL1 and the semiconductor region 14, and a depletion layer dep2 is formed between the bit line BL2 and the semiconductor region 14. Among the tail-cut voltages shown in Table 1, the voltage Vg (=−3V) is then applied (step S26). As shown in FIG. 8C, the electrons in the trapping layer 20b above the portion of the semiconductor region 14 that is neither the depletion layer dep1 nor the depletion layer dep2 flow as a FN tunneling current into the semiconductor region 14. As a result, the amount of electrons in the skirt area of the electron distribution 1 decreases, and the electron distribution 1 is turned into an electron distribution 1a. Since the depletion layer dep2 is also formed in the vicinity of the bit line BL2, the electrons of the electron distribution 2a can be prevented from flowing into the semiconductor region 14. Program verification is then performed. If the result of the program verification is "OK," the operation is ended. If not, the operation returns to step S22 (step S28).

Figure 9A:
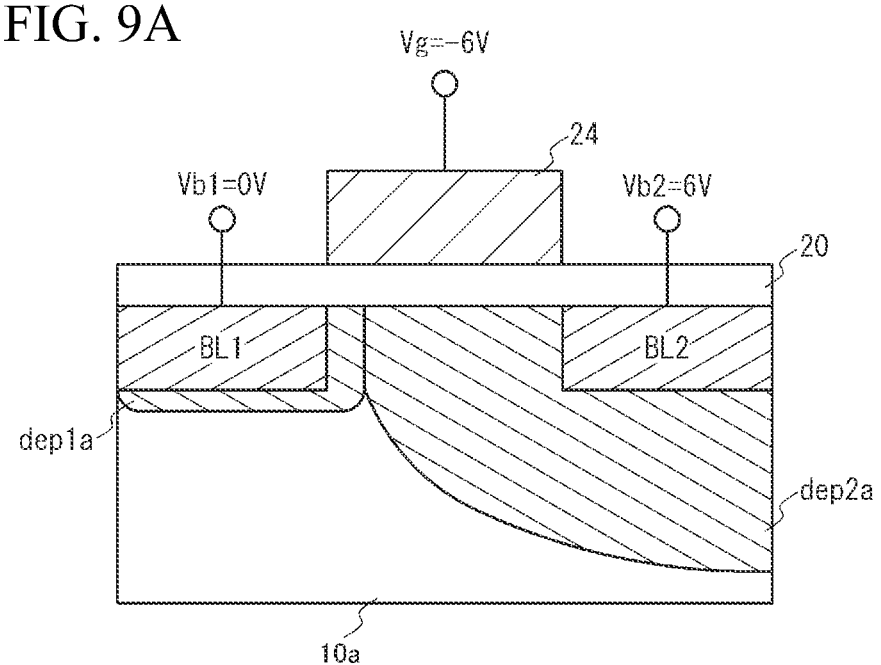
FIG. 9A and FIG. 9B are schematic views illustrating a method of erasing data in the first embodiment of the present invention.
Figure 9B:
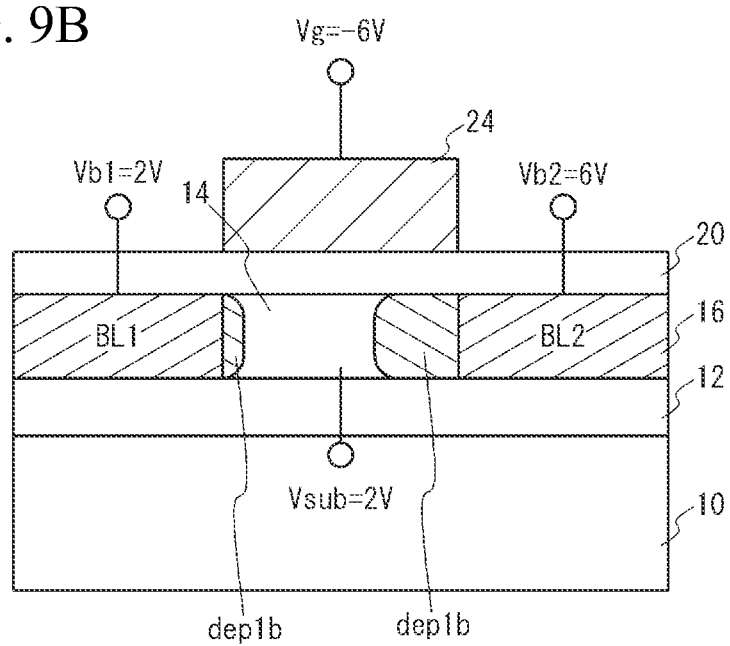

Next, a control operation to be performed when data is erased is described. FIG. 9A and FIG. 9B are schematic views of transistors that form memory cells in a case where data is erased through hot hole injection. FIG. 9A illustrates a conventional structure. In this conventional structure, the bit lines BL1 and BL2 are formed in the semiconductor substrate 10a. The portion of the semiconductor substrate 10a located between the bit lines BL1 and the BL2 is the channel. The ONO film 20 is formed on the semiconductor substrate 10a, and the word line 24 (the gate) is provided on the ONO film 20. Although the word line 24 extends in the transverse direction in reality, it is shown only above the channel in FIG. 9A, for ease of understanding. To inject hot holes so as to erase data, the voltage Vb1 (=0V), the voltage Vb2 (=6V), and the voltage Vg (=−6V) are applied to the bit line BL1, the bit line BL2, and the word line 24, respectively. As a result, a depletion layer dep1a and a depletion layer dep2a are formed in the vicinities of the bit lines BL1 and BL2, respectively. When the distance between the bit lines becomes shorter due to a size reduction of the memory cell, the depletion layers dep1a and dep2a are brought into contact with each other, resulting in punchthrough that allows the current between the bit lines BL1 and BL2 to flow into the semiconductor substrate 10a. As such, it is difficult to reduce the size of the memory cell with conventional methods in a flash memory with a conventional structure.

FIG. 9B is a schematic view of a memory cell in accordance with the first embodiment when data is to be erased through hot hole injection. The semiconductor substrate and the insulating layer 12 are provided in place of the semiconductor substrate 10a of FIG. 9A, and the region between the bit lines BL1 and BL2 is the semiconductor region 14. As shown in Table 1, the voltages Vb1 (=2V), Vb2 (=6V), Vg (=−6V), and Vsub (=2V) are applied to the bit lines BL1 and BL2, the word line 24 (the gate), and the semiconductor region 14, respectively. As shown in FIG. 9B, since the voltage Vsub (=2V) is applied to the semiconductor region 14, extensions of depletion layers dep1b and dep2b in the vicinities of the bit lines BL1 and BL2 can be restrained. Accordingly, the depletion layers dep1b and dep2b are not brought into contact with each other, and punchthrough is prevented. Thus, the size of the memory cell can be made smaller.

Next, an erasing operation with the use of a FN tunneling current is described. As shown in Table 1, the voltages Vb1 (=4V), Vb2 (=4V), Vg (=−8V), and Vsub (=4V) are applied to the bit lines BL1 and BL2, the word line 24 (the gate), and the semiconductor region 14, respectively. As a result, the electrons in the trapping layer flow as a FN tunneling current into the semiconductor region 14, which erases the data. Here, the voltage Vsub can be selectively applied to the region P shown in FIG. 1A in the first embodiment. Thus, the data in each memory cell in a selected area can be erased.

In accordance with the first embodiment, as shown in FIG. 1A through FIG. 1D, the metal plugs 34 and the wiring layer 44 (the first voltage applying unit) are coupled to the semiconductor regions 14 surrounded by the bit lines 16, the device isolating region 18, and the insulating layer 12, and, by virtue of the metal plugs 34 and the wiring layer 44, a voltage can be applied to each region P. In this manner, a voltage can be applied to the semiconductor substrate of each memory cell in a selected area.

As shown in steps S12 and S22 of FIG. 5 and FIG. 7, and as shown in FIG. 6A and FIG. 8A, charges are accumulated in the trapping layer in the ONO film 20. By virtue of the metal plugs 34 and the wiring layer 44, a voltage can be applied to the subject semiconductor region 14 so as to erase the charges in the skirt areas of the charge distributions, as shown in steps S14 and S16 of FIG. 5 and steps S24 and S26 of FIG. 7, and as shown in FIG. 6B, FIG. 6C, FIG. 8B, and FIG. 8C. Accordingly, the skirt areas of the distributions of charges (electrons) accumulated in the two locations of the trapping layer of the single memory cell can be prevented from overlapping with each other when the distance between the bit lines 16 is shortened. Thus, the size of the memory cell can be reduced.

Furthermore, a voltage is applied between the bit lines 16, so that hot electrons are injected into the trapping layer in the ONO film 20. In this manner, charges are accumulated in the trapping layer 20b in the ONO film 20, as shown in step S12 of FIG. 5 and step S22 of FIG. 7.

Further, the charge erasing in steps S14 and S16 of FIG. 5 and steps S24 and S26 of FIG. 7 is performed by applying a voltage to the semiconductor region 14 as in steps S14 and S24, and applying a voltage to the word line 24 as in steps S16 and S26. By doing so, depletion layers are formed between the bit lines 16 and the semiconductor region 14, as shown in FIG. 6B, FIG. 6C, FIG. 8B, and FIG. 8C. Thus, the electrons in the skirt areas of the distributions of accumulated charges (electrons) can be eliminated.

By virtue of the metal plugs 34 and the wiring layer 44, a voltage is applied to the subject semiconductor region 14 when the charges accumulated in the trapping layer in the ONO film 20 are erased, as shown in Table 1 and FIG. 9B. In this manner, punchthrough can be prevented when the charges are eliminated through hot hole injection, and the size of the memory cell can be reduced. When the charges are eliminated with the use of a FN tunneling current, the data in each memory cell in a selected area can be erased.

Second Embodiment

A second embodiment of the present invention is an example case where a pn-junction depletion layer is used as an isolating layer, and an n-type semiconductor layer is used as a device isolating region. FIG. 10A is a top view of the memory cell region of a flash memory in accordance with the second embodiment (a protection film 40, wiring layers 42, 44, 46, and 48, an interlayer insulating film 30, and an ONO film 20 are not shown). FIG. 10B, FIG. 10C, and FIG. 10D are cross-sectional views, taken along the lines A'-A', B'-B', and C'-C' of FIG. 10A, respectively.

As shown in FIG. 10B through 10D, this structure differs from the structure shown in FIG. 1B through FIG. 1D in that an n-type semiconductor layer 50 is provided on a silicon semiconductor substrate 10. A p-type semiconductor layer 52 surrounded by the n-type semiconductor layer 50 is also provided, and bit lines 16 are provided in the p-type semiconductor layer 52. The lower portions of the bit lines 16 are not in contact with the n-type semiconductor layer 50. As shown in FIG. 10A and FIG. 10D, a metal plug 38 coupled to the n-type semiconductor layer 50 and a wiring layer 48 are further provided. The other aspects of the structure are the same as those shown in FIG. 1A through FIG. 1D. The same components as those shown in FIG. 1A through FIG. 1D are denoted by the same reference numerals as those in FIG. 1A through FIG. 1D, and explanation of them is omitted here.

Figure 11A:
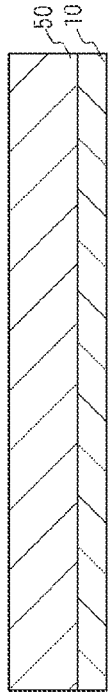
FIG. 11A through FIG. 11H are cross-sectional views illustrating the procedures for manufacturing the flash memory in accordance with the second embodiment of the present invention.
Figure 11B:
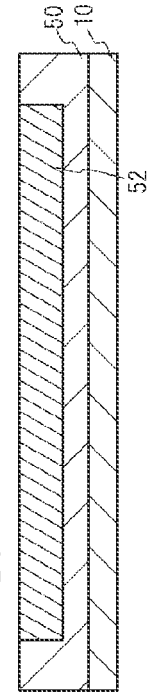
Figure 11C:
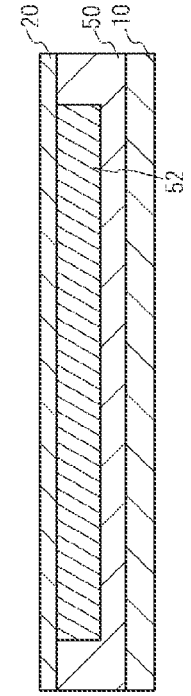
Figure 11D:
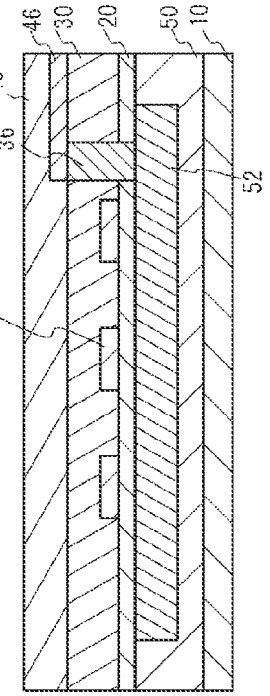
Figure 11E:
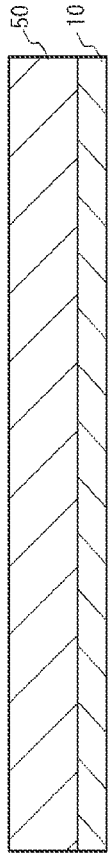
Figure 11F:

Referring now to FIG. 11A through FIG. 11H, a method of manufacturing the flash memory in a system in accordance with the second embodiment is described. FIG. 11A through FIG. 11D are cross-sectional views, taken along the line A'-A' of FIG. 10A. FIG. 11E through FIG. 11H are cross-sectional views, taken along the line B'-B' of FIG. 10A. As shown in FIG. 11A and FIG. 11E, arsenic ions, for example, are injected into the silicon semiconductor substrate 10, and heat treatment is carried out, so as to form the n-type semiconductor layer 50. As shown in FIG. 11B and FIG. 11F, phosphorus ions, for example, are injected into the n-type semiconductor layer 50, and heat treatment is carried out, so as to form the p-type semiconductor layer 52. Here, the p-type semiconductor layer 52 is formed in such a manner that the bottom face and the side faces of the p-type semiconductor layer 52 are surrounded by the n-type semiconductor layer 50.

Figure 11G:
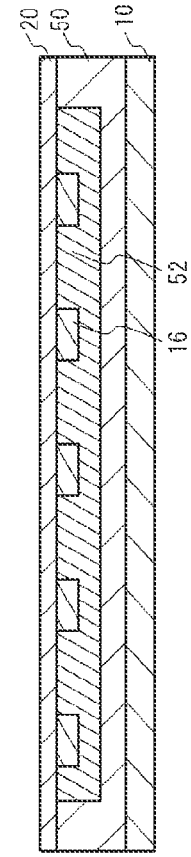
Figure 11H:
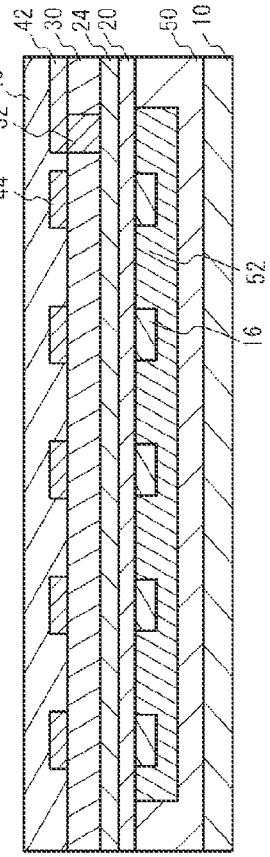

As shown in FIG. 11C and FIG. 11G, the ONO film 20 is formed in the same manner as in the first embodiment. Arsenic ions, for example, are injected into the p-type semiconductor layer 52, and heat treatment is carried out, so as to form the bit lines 16. The bit lines 16 are formed in such a manner that the bottom surfaces and the side surfaces of the bit lines 16 are surrounded by the p-type semiconductor layer 52. As shown in FIG. 11D and FIG. 11H, word lines 24, an interlayer insulating film 30, metal plugs 32, 34, 36, and 38, wiring layers 42, 44, 46, and 48, and a protection film 40 are formed in the same manner as in the first embodiment. Here, the metal plug 38 coupled to the n-type semiconductor layer 50 and the wiring layer 48 coupled to the metal plug 38 can be formed in the same manner as the metal plugs 32, 34, and 36 and the wiring layers 42, 44, and 46. In this manner, the flash memory in accordance with the second embodiment is completed.

Figure 12:
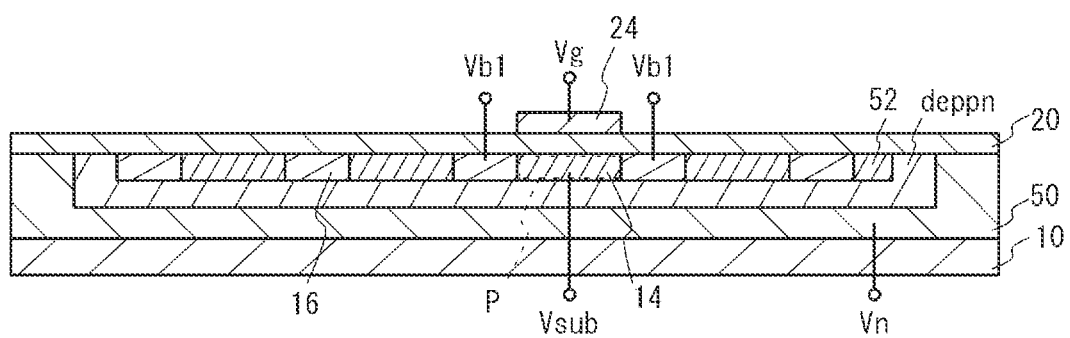
FIG. 12 is a schematic view illustrating an operation in accordance with the second embodiment of the present invention.

FIG. 12 illustrates a method of controlling the flash memory in a system accordance with the second embodiment. FIG. 12 shows the semiconductor substrate 10, the n-type semiconductor layer 50, the p-type semiconductor layer 52, the bit lines 16, the ONO film 20, and one of the word lines 24 of FIG. 10A. Although the word line 24 extends in the transverse direction in reality, it is shown only above the channel, for ease of understanding. With the use of the metal plugs 32, 34, 36, and 38, and the wiring layers 42, 44, 46, and 48, a voltage Vb1, a voltage Vb2, a voltage Vg, a voltage Vsub, and a voltage Vn are applied to the bit lines BL1 and BL2, the word line 24, the region P of the subject semiconductor region 14, and the n-type semiconductor layer 50, respectively.

First, a positive voltage is applied to the n-type semiconductor layer 50. As a result, a reverse bias is applied to the pn junction between the p-type semiconductor layer 52 and the n-type semiconductor layer 50. Accordingly, a depletion layer deppn is formed between the p-type semiconductor layer 52 and the n-type semiconductor layer 50, as shown in FIG. 12. As the depletion layer deppn is in contact with the bottom faces of the bit lines 16, the semiconductor regions 14 are formed in the regions P surrounded by the bit lines 16 and the depletion layer deppn in the p-type semiconductor layer 52. The semiconductor regions 14 are electrically isolated from one another. Accordingly, the depletion layer deppn functions as an isolating layer, like the insulating layer 12 of the first embodiment. The voltages Vb1, Vb2, Vg, and Vsub are then applied, as shown in FIG. 5 through FIG. 8 and Table 1 in the first embodiment. Through those procedures, the same operations as in the first embodiment can be performed, and the same effects as those of the first embodiment can be achieved.

In accordance with the second embodiment, the depletion layer deppn is formed as an isolating layer on the n-type semiconductor layer 50. As the depletion layer—at the interface between the n-type semiconductor layer 50 formed on the semiconductor substrate 10 and the p-type semiconductor layer 52—is used as an isolating layer, it is not necessary to use an expensive SOI substrate, and the production costs may be lower than the production costs of the first embodiment.

Also, in the second embodiment, the metal plug 38 and the wiring layer 48 (a second voltage applying unit) that are coupled to the n-type semiconductor layer 50 and applying such a voltage as to form the depletion layer deppn are provided, as shown in FIG. 10A through FIG. 10D. By virtue of the metal plug 38 and the wiring layer 48, a voltage is applied to the n-type semiconductor layer 50, so as to form the depletion layer deppn between the p-type semiconductor layer 52 and the n-type semiconductor layer 50.

Furthermore, as in the first and second embodiments, the device isolating region may include at least one of a buried oxide layer and an n-type semiconductor layer. With this arrangement, the semiconductor regions can be electrically isolated from each other with higher certainty.

Third Embodiment

A third embodiment of the present invention is an example case where an insulating substrate is used as an isolating layer, a groove portion is used as a device isolating region, and a polycrystalline silicon layer is used as semiconductor regions. FIG. 13A is a top view of the memory cell region of a flash memory in accordance with the third embodiment (a protection film 40, wiring layers 42, 44, and 46, an interlayer insulating film 30, and an ONO film 20 are not shown). FIG. 13B, FIG. 13C, and FIG. 13D are cross-sectional views, taken along the lines A"-A", B"-B", and C"-C" of FIG. 13A, respectively. As shown in FIG. 13B through FIG. 13D, this structure differs from the structure shown in FIG. 1B through FIG. 1D in that a polycrystalline silicon layer 57 is provided on an insulating substrate 54 (an isolating layer). Bit lines 16 are located in the polycrystalline silicon layer 57. The bottom faces of the bit lines 16 are in contact with the insulating substrate 54.

The portions of the polycrystalline silicon layer 57 located between the bit lines 16 are semiconductor regions 14. As shown in FIG. 13A through FIG. 13D, the portion of the polycrystalline silicon layer 57 that is located around the bit lines 16 and the semiconductor regions 14 and reaches the insulating substrate 54 is removed, so as to form a groove portion 58. The groove portion 58 serves as the device isolating region. The region P of each semiconductor region 14 is surrounded by the bit lines 16, the groove portion 58, and the insulating substrate 54, so that the semiconductor regions 14 are electrically isolated from one another. The other aspects of the structure are the same as those shown in FIG. 1B through FIG. 1D. The same components as those shown in FIG. 1B through FIG. 1D are denoted by the same reference numerals as those shown in FIG. 1B through FIG. 1D, and explanation of them is omitted here.

Figure 14A:
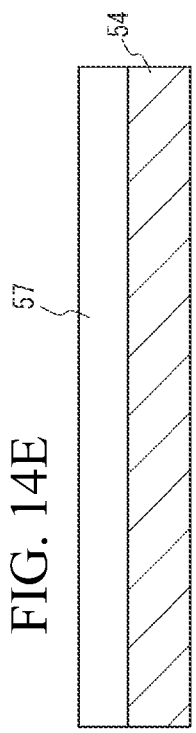
FIG. 14A through FIG. 14H are cross-sectional views illustrating a method of manufacturing the flash memory in accordance with the third embodiment of the present invention.
Figure 14B:
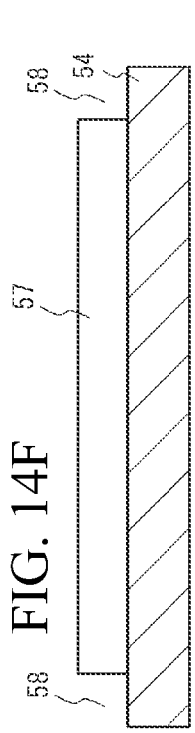
Figure 14C:
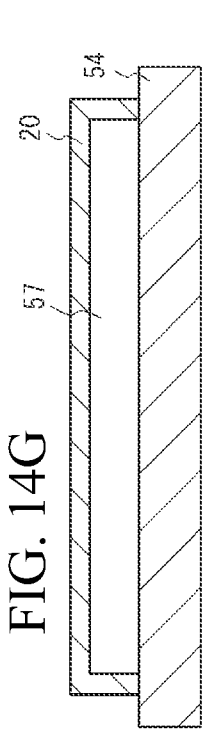
Figure 14D:
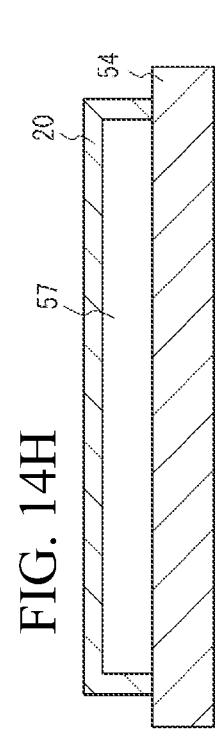
Figure 14E:
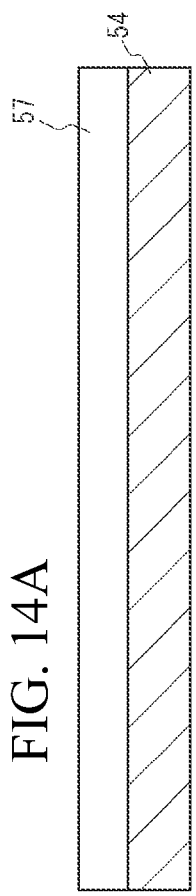
Figure 14F:
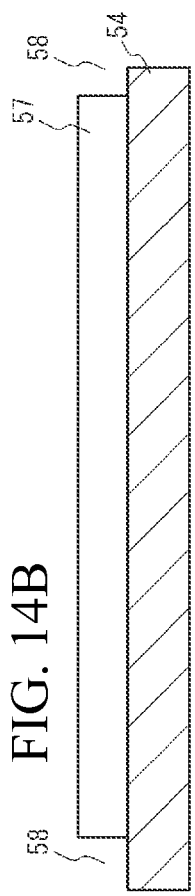
Figure 14G:
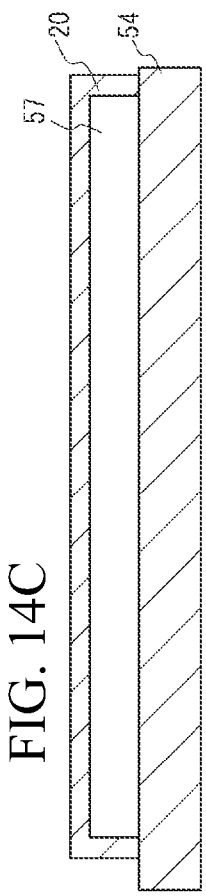
Figure 14H:
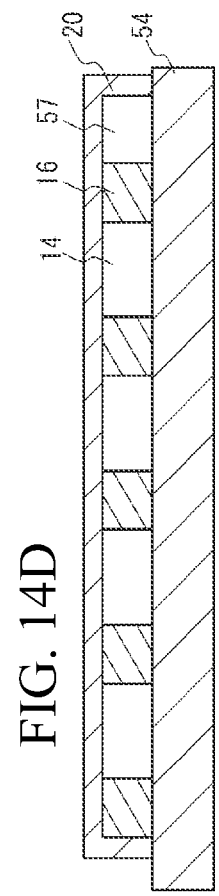
Figure 15C:
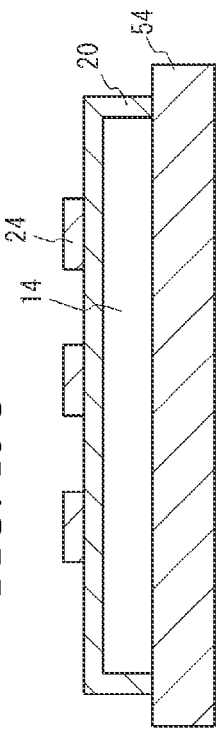
FIG. 15A through FIG. 15D are cross-sectional views illustrating the method of manufacturing the flash memory in accordance with the third embodiment of the present invention.
Figure 15D:
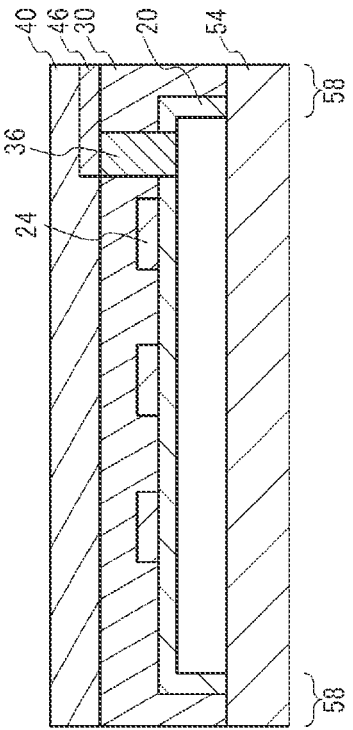
Figure 15A:
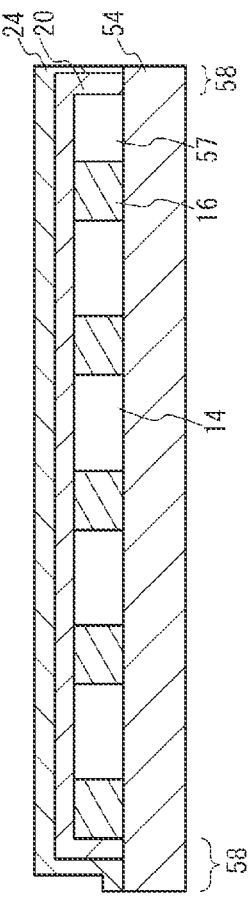
Figure 15B:
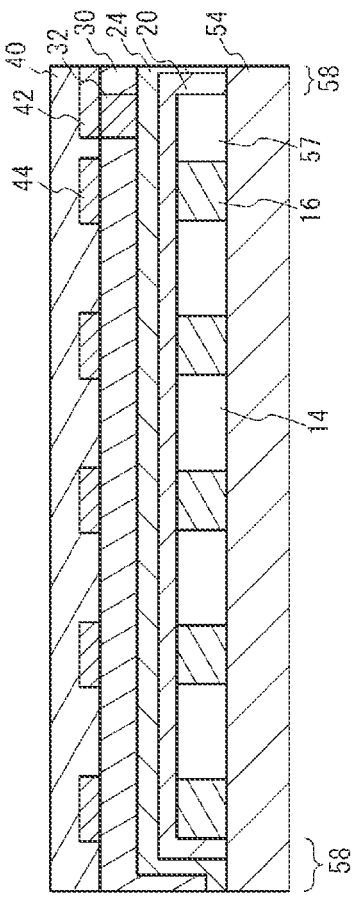
Figure 16:
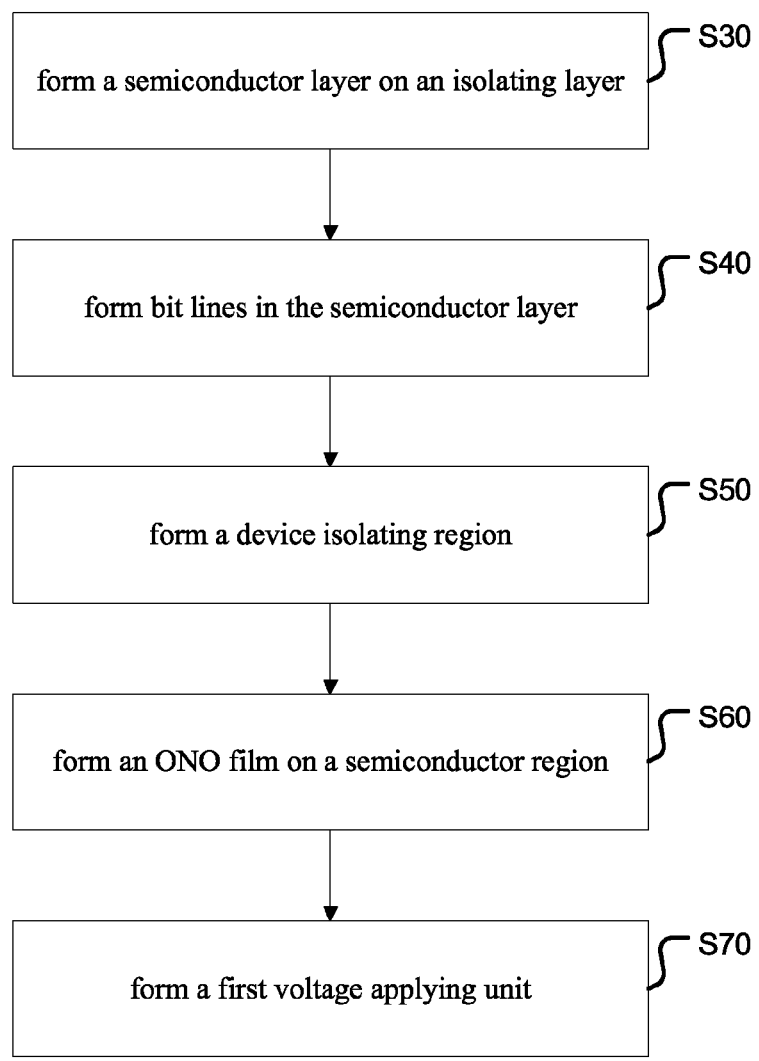
FIG. 16 is a flowchart of a process of manufacturing a semiconductor device in accordance with a third embodiment of the present invention.
Figure 17:
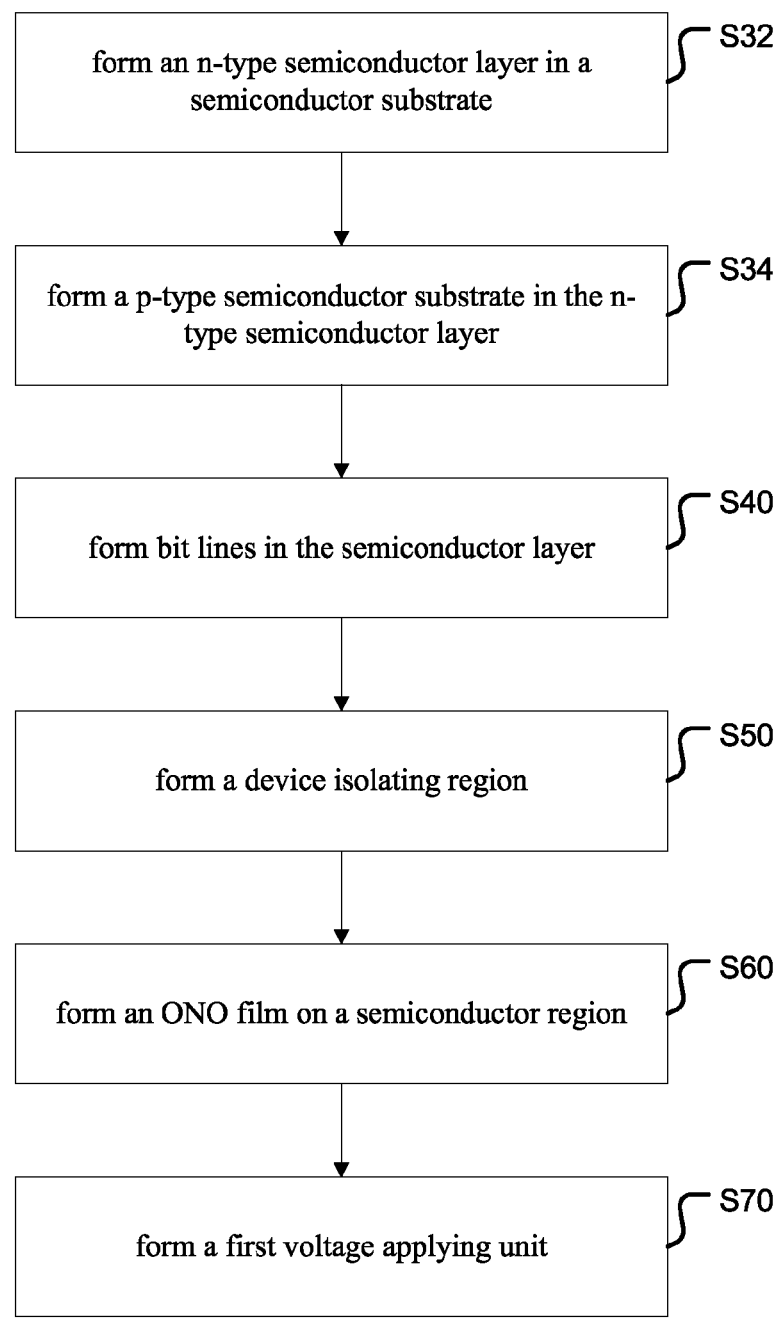
FIG. 17 is a flowchart of another process of manufacturing a semiconductor device in accordance with a third embodiment of the present invention.

Referring now to FIG. 14A through FIG. 17, a method of manufacturing the flash memory in a system in accordance with the third embodiment is described. FIG. 14A through FIG. 14D and FIG. 15A and FIG. 15B are cross-sectional views, taken along the line A"-A" of FIG. 13A. FIG. 14E through FIG. 14H and FIG. 15C and FIG. 15D are cross-sectional views, taken along the line B"-B" of FIG. 13A. FIG. 16 is a flowchart of a manufacture according to the third embodiment. FIG. 17 illustrates an alternative flowchart for a manufacture according to the third embodiment.

As shown in FIG. 14A and FIG. 14E, the p-type polycrystalline silicon layer 57 having B added thereto, for example, is formed (steps S30, S32, S34) by CVD on the insulating substrate 54 such as a quartz substrate, a glass substrate, or a sapphire substrate. As shown in FIG. 14B and FIG. 14F, the portion of the polycrystalline silicon layer 57 that reaches the insulating substrate 54 is removed, so as to form the groove portion 58. In this manner, the device isolating region is formed (step S50). As shown in FIG. 14C and FIG. 14G, the ONO film 20 is formed (step S60) on the polycrystalline silicon layer 57 in the same manner as in the first embodiment. Arsenic ions, for example, are injected into the polycrystalline silicon layer 57, and heat treatment is carried out, so as to form the bit lines 16 (step S40) reaching the insulating substrate 54 in the polycrystalline silicon layer 57. The portions of the polycrystalline silicon layer 57 that are located between the bit lines 16 are the semiconductor regions 14.

As shown in FIG. 15A and FIG. 15C, the word lines 24 are formed on the ONO film 20 in the same manner as in the first embodiment. As shown in FIG. 15B and FIG. 15D, the interlayer insulating film 30, the metal plugs 32, 34, and 36, the wiring layers 42, 44, and 46, and the protection film 40 are formed (step S70) in the same manner as in the first embodiment. Through the above described procedures, the flash memory in accordance with the third embodiment is completed.

In accordance with the third embodiment, the isolating layer includes the insulating substrate 54, and the semiconductor regions 14 include the polycrystalline silicon layer 57, as shown in FIG. 13A through FIG. 13D. As the insulating substrate 54 is used, it is not necessary to employ an expensive SOI substrate, and the production costs can be lowered. Furthermore, a polycrystalline silicon layer may be formed on the protection film 40 shown in FIG. 13B through FIG. 13D, so as to form a multilayer memory cell. Also, the device isolating region may include the groove portion 58 that is in contact with the insulating substrate 54.

The isolating layer and the device isolating region are not limited to the examples described in the first through third embodiments, and may have alternative embodiments, insofar as the embodiments are able to electrically isolate the semiconductor regions 14 from each other. Also, the first voltage applying unit and the second voltage applying unit should be electrically coupled to the semiconductor regions 14 and the n-type semiconductor layer 50, so as to apply voltages to the semiconductor regions 14 and the n-type semiconductor layer 50. In the first through third embodiments, three memory cells are shown in the extending direction of the bit line 16, and four memory cells are shown in the extending direction of the word lines 24. However, the number of memory cells is not limited to those numbers.

Several of the aspects of the present invention can be summarized as follows. According to an aspect of the present invention, there is provided a system including a semiconductor device comprising: a semiconductor region located in a semiconductor layer formed on an isolating layer; an ONO film on the semiconductor region; bit lines on either side of the semiconductor region, which are located in the semiconductor layer, and are in contact with the isolating layer; a device isolating region on two different sides of the semiconductor region from the sides on which the bit lines are located, the device isolating region being in contact with the isolating layer; and a first voltage applying unit that is coupled to the semiconductor region; wherein the semiconductor region is surrounded by the bit lines and the device isolating region, and is electrically isolated from other semiconductor regions. According to this aspect, the semiconductor region is electrically isolated from other semiconductor regions by the isolating layer, the device isolating region, and the bit lines. Further, the first voltage applying unit applies a voltage to the semiconductor region, so that a voltage can be applied to the semiconductor substrate of each memory cell in a selected area.

The semiconductor device may be configured so that the first voltage applying unit applies a voltage to the semiconductor region, so as to eliminate charges in a skirt area of a distribution of charges after the charges are accumulated in the ONO film. With this structure, the skirt areas of distributions of charges accumulated in two locations of the trapping layer of one memory cell can be prevented from overlapping with each other when the distance between the bit lines is shortened. Thus, the size of the memory cell can be reduced.

The semiconductor device may be configured so that the first voltage applying unit applies a voltage to the semiconductor region, so as to eliminate charges accumulated in the ONO film. With this structure, the data in each memory cell in a selected area can be erased.

The semiconductor device may be configured so that the isolating layer includes an insulating layer provided on a semiconductor substrate. With this structure, as the isolating layer includes an insulating layer, the semiconductor region can be electrically isolated from the other semiconductor regions with higher certainty.

The semiconductor device may be configured so that the semiconductor layer includes a p-type semiconductor layer, and the isolating layer includes a depletion layer formed on an n-type semiconductor layer. With this structure, as a semiconductor layer is used as the isolating layer, the production costs can be lowered.

The semiconductor device may further include a second voltage applying unit that applies a voltage to the n-type semiconductor layer, so as to form the depletion layer. With this structure, as a voltage is applied to the n-type semiconductor layer, a depletion layer can be formed.

The semiconductor device may be configured so that the isolating layer includes an insulating substrate, and the semiconductor layer includes a polycrystalline silicon layer. With this structure, as the isolating layer includes an insulating substrate, the production costs can be lowered.

The semiconductor device may be configured so that the device isolating region includes a groove portion that is in contact with the insulating substrate, or that the device isolating region includes at least one of a buried oxide layer and an n-type semiconductor layer. With this structure, the semiconductor region can be electrically isolated from the other semiconductor regions with higher certainty.

The semiconductor device may further include word lines that are located on the ONO film and intersect with the bit lines, wherein a plurality of charge accumulating regions are formed in the ONO film, the charge accumulating regions being located between the bit lines and below the word lines.

According to another aspect of the present invention, there is provided a method of controlling a semiconductor device in a system, the semiconductor device comprising a semiconductor region, an ONO film on the semiconductor region, and bit lines on either side of the semiconductor region, the method including: accumulating charges in the ONO film; and eliminating charges in a skirt area of a distribution of the charges accumulated in the ONO film. According to this aspect, the skirt areas of distributions of charges accumulated in two locations of the trapping layer of one memory cell can be prevented from overlapping with each other when the distance between the bit lines is shortened. Thus, the size of the memory cell can be reduced.

The method may be configured so that accumulating charges in the ONO film includes applying a voltage between the bit lines so as to inject hot electrons into the ONO film.

The method may be configured so that the semiconductor device has word lines that intersect with the bit lines on the ONO film, and that eliminating the charges includes: applying a voltage to the semiconductor region; and applying a voltage to the word lines.

According to yet another aspect of the present invention, there is provided a method of controlling a semiconductor device in a system, the semiconductor device including: a semiconductor region in a semiconductor layer formed on an isolating layer; an ONO film on the semiconductor region; bit lines on either side of the semiconductor region, which are located in the semiconductor layer, and are in contact with the isolating layer; a device isolating region on two different sides of the semiconductor region from the sides on which the bit lines are provided, the device isolating region being in contact with the isolating layer; and a first voltage applying unit that is coupled to the semiconductor region, the semiconductor region being surrounded by the bit lines and the device isolating region, and being electrically isolated from other semiconductor regions, the method including: applying a voltage to the semiconductor region; and eliminating charges accumulated in the ONO film. According to this aspect, the semiconductor region is electrically isolated from other semiconductor regions by the isolating layer, the device isolating region, and the bit lines. Further, the first voltage applying unit applies a voltage to the semiconductor region, so that the data in each memory cell in a selected area can be erased.

According to a further aspect of the present invention, there is provided a method of manufacturing a semiconductor device in a system, the method including: forming a semiconductor layer on an isolating layer; forming bit lines in the semiconductor layer, the bit lines being in contact with the isolating layer; forming a device isolating region in contact with the isolating layer; forming an ONO film on a semiconductor region that is located between regions in which the bit lines are formed; and forming a first voltage applying unit that is coupled to the semiconductor region, wherein the device isolating region is formed on two different sides of the semiconductor region from sides on which the bit lines are formed, so as to be in contact with the isolating layer. According to this aspect, the semiconductor region is electrically isolated from other semiconductor regions by the isolating layer, the device isolating region, and the bit lines. Further, it is possible to produce a semiconductor device that can apply a voltage to the semiconductor substrate of each memory cell in a selected area, as the first voltage applying unit applies a voltage to the semiconductor region.

The method may be configured so that the isolating layer includes an insulating layer formed on a semiconductor substrate. With this structure, as the isolating layer includes an insulating layer, it is possible to produce a semiconductor device that can electrically isolate the semiconductor region from the other semiconductor regions with higher certainty.

The method may be configured so that the isolating layer includes an insulating substrate, and that forming the semiconductor layer includes forming a polycrystalline silicon layer on the isolating layer. With this structure, the production costs can be lowered, as the insulating substrate is employed.

The method may be configured so that forming the device isolating region includes forming a groove portion that is in contact with the insulating substrate. With this structure, it is possible to produce a semiconductor device that can electrically isolate the semiconductor region from the other semiconductor regions with higher certainty.

According to a still further aspect of the present invention, there is provided a method of manufacturing a semiconductor device in a system, the method including: forming an n-type semiconductor layer in a semiconductor substrate; forming a p-type semiconductor substrate in the n-type semiconductor layer, so that a bottom surface and side surfaces of the p-type semiconductor substrate are in contact with the n-type semiconductor layer; forming bit lines in the p-type semiconductor layer; forming an ONO film on a semiconductor region that is located between regions in which the bit lines are formed; forming a first voltage applying unit that is coupled to the semiconductor region; and forming a second voltage applying unit that is coupled to the n-type semiconductor layer. According to this aspect, as a voltage is applied to the second voltage applying unit, a depletion layer surrounded by the semiconductor region, the n-type semiconductor layer, and the bit lines can be formed. With the depletion layer, the semiconductor region can be electrically isolated from the other semiconductor regions. Further, as the first voltage applying unit applies a voltage to the semiconductor region, the data in each memory cell in a selected area can be erased.

As described above, the present invention can provide a system including a semiconductor device that can shorten the distance between the bit lines and apply a voltage to the semiconductor substrate of each memory cell in a selected area. The present invention can also provide a method of controlling a semiconductor device in such a system and a method of manufacturing a semiconductor device in such a system.

Embodiments of the present invention generally relate to nonvolatile memory devices. More particularly, embodiments provide a semiconductor device, a method of controlling the semiconductor device, and a method of manufacturing the semiconductor device, by which the distance between bit lines can be shortened, and a voltage can be applied to the semiconductor substrate of each memory cell in a selected area.

In one implementation, the various embodiments are applicable to flash memory and devices that utilize flash memory. Flash memory is a form of non-volatile memory that can be electrically erased and reprogrammed As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells," each of which traditionally stores one bit of information. However, newer flash memory devices can store more than 1 bit per cell. These newer flash memory devices double the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, newer flash memory devices have several key advantages, such as being capable of burst-mode access as fast as 80 MHz, page access times as fast as 25 ns, simultaneous read-write operation for combined code and data storage, and low standby power (e.g., 1 μA).

Figure 18:
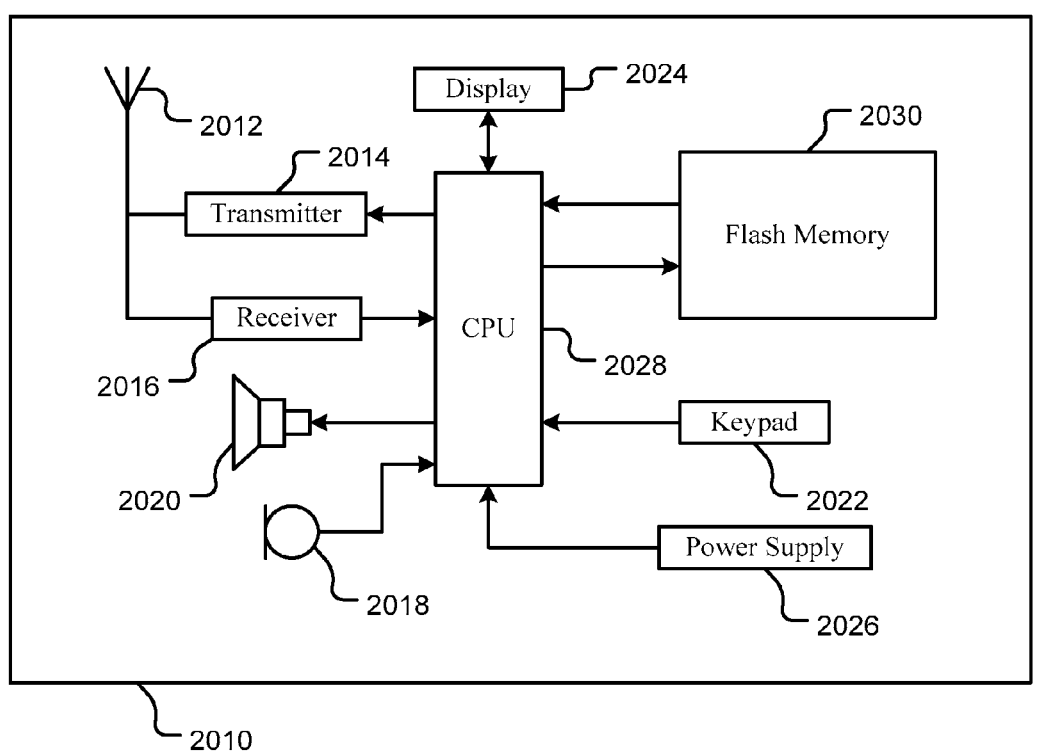
FIG. 18 illustrates a block diagram of an exemplary portable phone, upon which various embodiments of the invention may be implemented.

FIG. 18 shows a block diagram of an exemplary portable telephone 2010 (e.g., cell phone, cellular phone, mobile phone, internet protocol phone, wireless phone, etc.), upon which various embodiments of the invention can be implemented. The cell phone 2010 includes an antenna 2012 coupled to a transmitter 2014 and a receiver 2016, as well as a microphone 2018, a speaker 2020, a keypad 2022, and a display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 can comprise a semiconductor device, a method of controlling the semiconductor device, and a method of manufacturing the semiconductor device, by which the distance between bit lines can be shortened, and a voltage can be applied to the semiconductor substrate of each memory cell in a selected area.

In various embodiments, the flash memory 2030 can be utilized with various devices, such as mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are coupled to the bit lines in a parallel configuration, while in a conventional NAND-type flash memory, the memory cell transistors are coupled to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps), flash memory requirements have steadily increased. Thus, an improved flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

It is noted that the components (e.g., 2012, 2014, 2016, 2022, 2028, 2030, etc.) of portable telephone 2010 can be coupled to each other in a wide variety of ways. For example, in an embodiment, the antenna 2012 can be coupled to transmitter 2014 and receiver 2016. Additionally, the transmitter 2014, receiver 2016, speaker 2020, microphone 2018, power supply 2026, keypad 2022, flash memory 2030 and display 2024 can each be coupled to the processor (CPU) 2028. It is pointed out that in various embodiments, the components of portable telephone 2010 can be coupled to each other via, but are not limited to, one or more communication buses, one or more data buses, one or more wireless communication technologies, one or more wired communication technologies, or any combination thereof.

Figure 19:
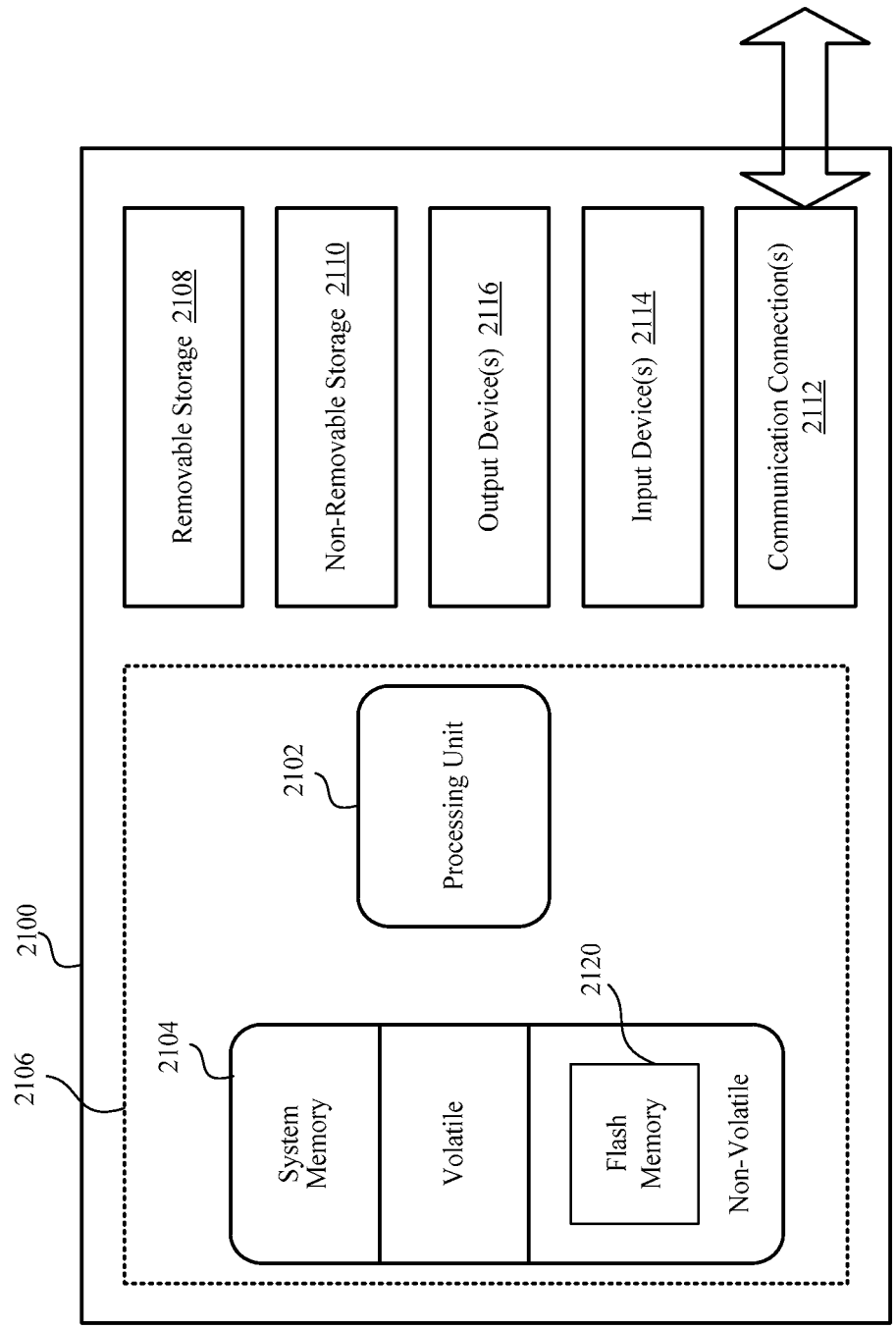
FIG. 19 illustrates a block diagram of an exemplary computing device, upon which various embodiments of the invention may be implemented.

FIG. 19 illustrates a block diagram of an exemplary computing device 2100, upon which various embodiments of the invention can be implemented. Although computing device 2100 is shown and described in FIG. 19 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. In an embodiment, computing device 2100 can include additional components not shown in FIG. 19.

Also, it is appreciated that the computing device 2100 can be a variety of things. For example, computing device 2100 may be, but is not limited to, a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounter frequent physical impacts. Also, flash memory is more able than other types of memory to withstand intense physical pressure and/or heat. Thus, portable computing devices are able to be used in a greater range of environmental variables.

Computing device 2100 can include at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 19 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could be a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 10 by removable storage 2108 and non-removable storage 2110.

Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, Flash memory 2120 may comprise a semiconductor device, a method of controlling the semiconductor device, and a method of manufacturing the semiconductor device, by which the distance between bit lines can be shortened, and a voltage can be applied to the semiconductor substrate of each memory cell in a selected area.

In various embodiments, the flash memory 2120 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. Further, in one embodiment, the flash memory 2120 utilizes newer flash memory technology to allow storing of two physically distinct bits on opposite sides of a memory cell.

Device 2100 may also contain communications connection(s) or coupling(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection or coupling, and wireless media such as acoustic, radio frequency (RF), infrared and other wireless media. The term computer readable media as used herein includes both storage media and communication media.

It is noted that the components (e.g., 2102, 2104, 2110, 2120, etc.) of computing device 2100 can be coupled to each other in a wide variety of ways. For example in various embodiments, the components of computing device 2100 can be coupled to each other via, but are not limited to, one or more communication buses, one or more data buses, one or more wireless communication technologies, one or more wired communication technologies, or any combination thereof.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous.

Figure 20:
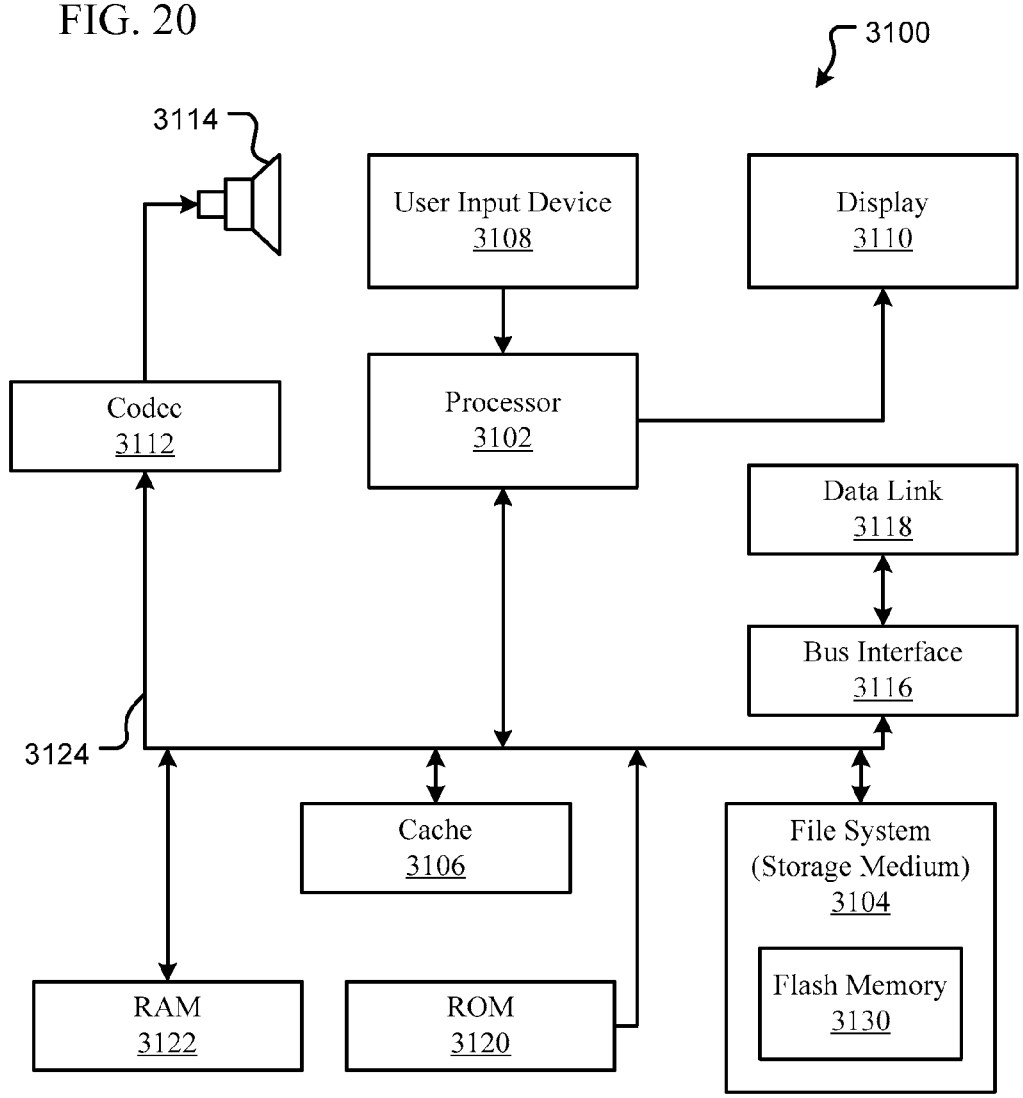
FIG. 20 illustrates an exemplary portable multimedia device, or media player, in accordance with various embodiments of the invention.

FIG. 20 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage medium or a plurality of storage media, such as disks, memory cells, and the like. The file system 3104 typically provides high capacity storage capability for the media player 3100. Also, file system 3104 includes flash memory 3130. In the present embodiment, Flash memory 3130 may comprise a semiconductor device, a method of controlling the semiconductor device, and a method of manufacturing the semiconductor device, by which the distance between bit lines can be shortened, and a voltage can be applied to the semiconductor substrate of each memory cell in a selected area.

In various embodiments, the flash memory 3130 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the media player 3100 or external to the media player 3100. For example, headphones or earphones that couple to the media player 3100 would be considered an external speaker.

In a particular embodiment, the available media assets are arranged in a hierarchical manner based upon a selected number and type of groupings appropriate to the available media assets. For example, in the case where the media player 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

It is noted that the components (e.g., 3102, 3104, 3120, 3130, etc.) of media player 3100 can be coupled to each other in a wide variety of ways. For example, in an embodiment, the codec 3122, RAM 3122, ROM 3120, cache 3106, processor 3102, storage medium 3104, and bus interface 3116 can be coupled to data bus 3124. Furthermore, the data link 3118 can be coupled to the bus interface 3116. The user input device 3108 and the display 3110 can be coupled to the processor 3102 while the speaker 3114 can be coupled to the codec 3112. It is pointed out that in various embodiments, the components of media player 3100 can be coupled to each other via, but are not limited to, one or more communication buses, one or more data buses, one or more wireless communication technologies, one or more wired communication technologies, or any combination thereof.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

The invention claimed is:

1. A method of manufacturing a semiconductor device, comprising:
   forming a semiconductor layer on an isolating layer;
   forming a semiconductor region on the semiconductor layer;
   forming a plurality of bit lines in the semiconductor layer on either side of the semiconductor region, the plurality of bit lines being in contact with the isolating layer;
   forming a device isolating region comprising a buried oxide film in contact with a top surface of the isolating layer wherein the device isolation region surrounds the recited bit lines;
   forming an ONO film on the semiconductor region that is located between regions in which the bit lines are formed; and
   forming a first voltage applying unit that is coupled to the semiconductor region, wherein the device isolating region is formed on two different sides of the semiconductor region from sides on which the bit lines are formed, so as to be in contact with the isolating layer,
   wherein forming the semiconductor layer on the isolating layer further comprises:
   forming an n-type semiconductor layer in a semiconductor substrate;
   forming a p-type semiconductor substrate in the n-type semiconductor layer,
   so that a bottom surface and side surfaces of the p-type semiconductor substrate are in contact with the n-type semiconductor layer.

2. The method as claimed in claim 1, wherein the isolating layer includes an insulating layer formed on a semiconductor substrate.

3. The method as claimed in claim 1, wherein the isolating layer includes an insulating substrate.

4. The method as claimed in claim 3, wherein forming the device isolating region includes forming a groove portion that is in contact with the insulating substrate.

5. The method as claimed in claim 1, wherein the semiconductor layer comprises a plurality of semiconductor regions.

6. The method as claimed in claim 1, wherein a semiconductor region of the plurality of semiconductor regions is electrically isolated from other semiconductor regions.

7. The method as claimed in claim 1, wherein forming the semiconductor layer includes forming a polycrystalline silicon layer on the isolating layer.

8. The method as claimed in claim 1, further comprising forming a second voltage applying unit that is coupled to the n-type semiconductor layer.

9. The method as claimed in claim 1, further comprising forming a plurality of charge accumulating regions in the ONO film.

10. The method as claimed in claim 9, further comprising forming a plurality of word lines that intersect with the plurality of bit lines on the ONO film.

11. The method as claimed in claim 10, wherein the plurality of charge accumulating regions are located between the plurality of bit lines and below the plurality of word lines.

12. A method of controlling a semiconductor device comprising:
    forming a semiconductor layer on an isolating layer;
    forming an n-type semiconductor layer in a semiconductor substrate;
    forming a p-type semiconductor substrate in the n-type semiconductor layer, so that a bottom surface and side surfaces of the p-type semiconductor substrate are in contact with the n-type semiconductor layer;
    accumulating a plurality of charges in an ONO film provided on a semiconductor region; and
    eliminating charges in an outer area of a distribution of the charges accumulated in the ONO film,
    wherein a plurality of bit lines is provided on either side of the semiconductor region, a device isolating region comprising a material layer is provided on two different and opposite sides of the plurality of bit lines wherein the device isolation region comprising a buried oxide film surrounds the recited bit lines and contacts a top surface of an isolating layer, and a first voltage applying unit is coupled to the semiconductor region and which provides the plurality of charges.

13. The method as claimed in claim 12, wherein accumulating the plurality of charges in the ONO film includes applying a voltage between the bit lines so as to inject hot electrons into the ONO film.

14. The method as claimed in claim 12, wherein the semiconductor device comprises word lines that intersect with the plurality of bit lines on the ONO film.

15. The method as claimed in claim 14, wherein eliminating the charges comprises:
   applying a voltage to the semiconductor region; and
   applying a voltage to the word lines.

16. The method as claimed in claim 12, wherein the semiconductor device comprises a portable media player.

17. The method as claimed in claim 12, wherein the semiconductor device comprises a wireless communications device.

18. The method as claimed in claim 12, wherein the semiconductor device comprises a computing device.

\* \* \* \* \*